(12) United States Patent
Shimada et al.

(10) Patent No.: US 6,580,632 B2
(45) Date of Patent: Jun. 17, 2003

(54) SEMICONDUCTOR MEMORY DEVICE, METHOD FOR DRIVING THE SAME AND METHOD FOR FABRICATING THE SAME

(75) Inventors: Yasuhiro Shimada, Muko (JP); Koji Arita, Osaka (JP); Kiyoshi Uchiyama, Colorado Springs, CO (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/782,300

(22) Filed: Feb. 14, 2001

(65) Prior Publication Data

US 2001/0019497 A1 Sep. 6, 2001

(30) Foreign Application Priority Data

Feb. 15, 2000 (JP) ........................................ 2000-036140

(51) Int. Cl.[7] ................................................ G11C 11/22
(52) U.S. Cl. ..................... 365/145; 365/65; 365/185.24
(58) Field of Search ...................... 365/145, 65, 185.24

(56) References Cited

U.S. PATENT DOCUMENTS 5,432,731 A * 7/1995 Kirsch et al. ............... 365/145
6,046,926 A * 4/2000 Tanaka et al. .............. 365/145
6,141,238 A * 10/2000 Forbes et al. ............... 365/145
6,337,805 B1 * 1/2002 Forbes et al. ............... 365/145

* cited by examiner

Primary Examiner—David Nelms
Assistant Examiner—Connie C. Yoha
(74) Attorney, Agent, or Firm—Nixon Peabody LLP; Donald R. Studebaker

(57) ABSTRACT

Data is read out from a ferroelectric film with its remnant polarization associated with one of two possible logical states of the data and with a bias voltage applied to a control gate electrode over the ferroelectric film. The ferroelectric film creates either up or down remnant polarization. So the down remnant polarization may represent data "1" while the up or almost zero remnant polarization may represent data "0", for example. By regarding the almost zero remnant polarization state as representing data "0", a read current value becomes substantially constant in the data "0" state. As a result, the read accuracy improves. Also, if imprinting of one particular logical state (e.g., data "1") is induced in advance, then the read accuracy further improves.

20 Claims, 12 Drawing Sheets

SEMICONDUCTOR MEMORY DEVICE, METHOD FOR DRIVING THE SAME AND METHOD FOR FABRICATING THE SAME

BACKGROUND OF THE INVENTION

The present invention relates to a semiconductor memory device with such a structure as changing a potential level in the channel region of a field effect transistor (FET) by utilizing the hysteresis properties of a ferroelectric film.

An FET, called "MFISFET", "MFSFET" or "MFMISFET", has been known as a semiconductor memory device including a non-volatile storage section with a ferroelectric thin film in its gate. An FET with such a structure will be herein called a "ferroelectric FET".

FIG. 8 is a cross-sectional view of a known ferroelectric FET implemented as an MFISFET. As shown in FIG. 8, the FET includes silicon substrate 101, silicon dioxide ($SiO_2$) film 102, ferroelectric film 103, gate electrode 104 and source/drain regions 105 and 106. The $SiO_2$ film 102, ferroelectric film 103 and gate electrode 104 are stacked in this order on the substrate 101. The ferroelectric film 103 is made of a metal oxide such as lead zirconate titanate (PZT) or bismuth strontium tantalate (SBT). The gate electrode 104 is made of a conductor like platinum (Pt). And the source/drain regions 105 and 106 are defined in the substrate 101 and located on right- and left-hand sides of the gate electrode 104. In this device, part of the substrate 101 under the $SiO_2$ film 102 serves as a channel region 107.

In the structure shown in FIG. 8, the ferroelectric film 103 exhibits electric spontaneous polarization of one of the following two types. More specifically, the electric dipole moment in the film 103 is either upward or downward depending on the polarity of a voltage applied between the gate electrode 104 and substrate 101. As used herein, the "upward electric dipole moment" refers to the electric moment of electric dipoles showing positive polarity at their upper end, while the "downward electric dipole moment" refers to the electric moment of electric dipoles showing positive polarity at their lower end. The ferroelectric film 103 also shows dielectric hysteresis. That is to say, even after the voltage applied is removed, the polarization of either type remains in the film 103. Thus, the film 103 exhibits one of these two different types of remnant polarization while zero voltage is applied to the gate electrode 104. As a result, the channel region 107 of the ferroelectric FET enters one of two different states with mutually different potential depths corresponding to these two different types of remnant polarization. On the other hand, the source-drain resistance of the ferroelectric FET changes with the potential depth in the channel region 107. Accordingly, it depends on the type of remnant polarization exhibited by the ferroelectric film 103 whether the source-drain resistance becomes relatively high or relatively low. And one of these two different states, corresponding to the high and low source-drain resistance values, respectively, is retained (or stored) so long as the ferroelectric film 103 keeps its remnant polarization. This is why a nonvolatile memory device is realized by a ferroelectric FET like this.

In a nonvolatile memory device using the known ferroelectric FET, one state assumed by the ferroelectric film 103 with the down remnant polarization is normally associated with data "1". The other state assumed by the ferroelectric film 103 with the up remnant polarization is normally associated with data "0". To create the down remnant polarization in the ferroelectric film 103, a positive voltage may be applied to the gate electrode 104 with the backside of the substrate 101 grounded, and then the voltage applied to the electrode 104 may be reset to the ground level, for example. The up remnant polarization can be created in the ferroelectric film 103 in a similar manner. Specifically, first, a negative voltage may be applied to the gate electrode 104 with the backside of the substrate 101 grounded, and then the voltage applied to the electrode 104 may be reset to the ground level, for example.

FIGS. 9A, 9B and 9C are energy band diagrams illustrating respective energy band states corresponding to down, up and almost zero remnant polarization exhibited by the ferroelectric film 103. Each of these diagrams is illustrated for a cross section passing the gate electrode 104, ferroelectric film 103, $SiO_2$ film 102 and channel region 107. In the example illustrated in FIGS. 9A, 9B and 9C, the substrate 101 is a p-type silicon substrate, the source/drain regions 105 and 106 are n-type semiconductor regions, and the arrows indicate the polarization directions of the ferroelectric film 103.

To create the state shown in FIG. 9A, a voltage is applied to the gate electrode 104 so that the electrode 104 has a positive potential level with respect to the substrate 101. That is to say, a positive voltage is applied to the electrode 104. In this case, a potential difference produced between the electrode 104 and substrate 101 is allotted at a certain ratio to the ferroelectric and $SiO_2$ films 103 and 102 located between the electrode 104 and substrate 101. Specifically, if the voltage applied to the electrode 104 is regulated in such a manner as to make the potential difference allotted to the ferroelectric film 103 greater than a polarization reversal voltage of the film 103, then the film 103 exhibits down polarization. Thereafter, when the voltage applied to the electrode 104 is removed to reset the electrode 104 to the ground level, the film 103 produces down remnant polarization as shown in FIG. 9A. While the remnant polarization is downward (i.e., in the data "1" state), an electric field, created between the lower and upper ends of the ferroelectric film 103 with positive and negative polarities, respectively, bends the energy bands of the ferroelectric film 103, $SiO_2$ film 102 and channel region 107 as shown in FIG. 9A. In such a situation, part of the channel region 107 near the interface between the region 107 and $SiO_2$ film 102 changes its conductivity type from p- into n-type. That is to say, negative ions are densely concentrated at that part of the channel region 107. As a result, a depletion layer expands to the deeper part of the substrate 101, and the potential level at that part near the Si—$SiO_2$ interface becomes lower than the ground level. In other words, a so-called "inversion layer" is formed in that part of the channel region 107.

On the other hand, to create the state shown in FIG. 9B, another voltage is applied to the gate electrode 104 so that the electrode 104 has a negative potential level with respect to the substrate 101. That is to say, a negative voltage is applied to the electrode 104. In this case, the voltage applied to the electrode 104 is regulated in such a manner as to make the potential difference allotted to the ferroelectric film 103 greater than the polarization reversal voltage of the film 103. Thereafter, when the voltage applied to the electrode 104 is removed to reset the electrode 104 to the ground level, the film 103 produces up remnant polarization as shown in FIG. 9B. While the remnant polarization is upward (i.e., in the data "0" state), an electric field, created between the lower and upper ends of the ferroelectric film 103 with negative and positive polarities, respectively, bends the energy bands of the ferroelectric film 103, $SiO_2$ film 102 and channel region 107 as shown in FIG. 9B. In such a situation, however, holes, or majority carriers, are densely concentrated in that part of the channel region 107 near the Si—SiO$_2$ interface. Accordingly, no depletion layer is formed in the channel region and the potential level at the channel region 107 is substantially equal to the ground level.

As can be seen, the potential level at that part of the channel region 107 near the Si—SiO$_2$ interface changes depending on the direction of the remnant polarization. Accordingly, if a potential difference is produced between the source/drain regions 105 and 106 as a pair of n-type semiconductor regions, the amount of current flowing between these regions 105 and 106 also changes with the remnant polarization direction. Specifically, in the data "1" state, in which the potential level at the channel region 107 is lower than the ground level, the inversion layer is formed in the channel region 107 and therefore, the source-drain resistance is relatively low (i.e., in ON state). As a result, a large amount of current flows between the source/drain regions 105 and 106. In contrast, in the data "0" state, in which the potential level at the channel region 107 is equal to the ground level, no inversion layer is formed in the channel region 107 and therefore, the source-drain resistance is relatively high (i.e., in OFF state). As a result, current hardly flows between the source/drain regions 105 and 106. In other words, by measuring the current flowing between the source/drain regions 105 and 106, it is possible to know, by the amount of the current measured, whether the ferroelectric FET is in the data "1" or data "0" state.

As can be seen, to read the data state of a ferroelectric FET, just a potential difference should be created between the source/drain regions 105 and 106 but no bias needs to be applied to the gate electrode 104 as a matter of principle. That is to say, the ON state of a ferroelectric FET corresponds to the depletion mode of an MOS transistor.

The known ferroelectric FET, however, has the following drawbacks.

FIG. 10 is a graph illustrating a relationship between the voltage Vg applied to the gate electrode 104 of a ferroelectric FET and the source-drain current Ids in accordance with the results of experiments we carried out. As shown in FIG. 10, in reading out data by removing the voltage that has been applied to the gate electrode 104, a difference ΔI1 between currents flowing in the data "1" and "0" states is small. This is probably because when zero voltage is applied to the gate electrode 104, the inversion layer formed in the channel region 107 has just a low intensity as shown in FIG. 9A. Accordingly, if the polarization of the ferroelectric film 103 has been changed with time, it might be difficult to read out data accurately enough, or to tell the data "0" state from the data "1" state definitely.

The known ferroelectric FET also has another problem. Specifically, if data "0" or "1" is stored on the device for a long period of time, then the hysteresis loop shifts in either the positive or negative direction along the voltage axis to create polarization in the direction associated with the data stored much more easily. This is called an "imprint degradation". When this failure occurs, the ferroelectric film 103, which has been kept in a particular polarization state for a long time, will have its coercive voltage much increased. As used herein, the "coercive voltage" is a voltage that should be applied to switch one polarization state into the other. That is to say, if the coercive voltage has increased, then polarization in the direction corresponding to the long-stored data occurs easily, but polarization in the opposite direction hardly occurs. Once the "imprint degradation" happens after data "1" or "0" has been stored on the ferroelectric film 103 of the ferroelectric FET for a long time, the ferroelectric film 103 will have a remnant polarizability different from its initial value. Accordingly, if some data is read out after having been retained there for a long time, the data could have a signal level (or read current value) different from an initial signal level (or read current value).

SUMMARY OF THE INVENTION

An object of the present invention is providing a semiconductor memory device that also changes a potential level at the channel region of an FET by utilizing the hysteresis of a ferroelectric thin film, but still can read out even long-stored data accurately enough.

Another object of the present invention is providing a method for driving a semiconductor memory device of that type.

Still another object of the present invention is providing a method for fabricating a semiconductor memory device of that type.

An inventive semiconductor memory device includes a field effect transistor. The transistor includes: a semiconductor substrate; a ferroelectric film and a gate electrode stacked in this order over the substrate; and source/drain regions defined in the substrate and located on right- and left-hand sides of the gate electrode. The ferroelectric film exhibits a first or second type of polarization. The first type of polarization is created when a voltage is applied to the gate electrode so that the electrode has a positive potential level with respect to the substrate. The second type of polarization is created when another voltage is applied to the gate electrode so that the electrode has a negative potential level with respect to the substrate. Data in a first or second logical state is stored in the ferroelectric film. The first logical state is defined as a state in which one of the first and second types of polarization remains in the ferroelectric film to which zero voltage is being applied. The second logical state is defined as a state in which either the other type of polarization or there is almost no remnant polarization in the ferroelectric film to which the zero voltage is being applied.

In this semiconductor device, even if data in the second logical state, written on the ferroelectric film, is indefinite or if there is almost no remnant polarization in the ferroelectric film, data can be read out accurately with the first and second logical states distinguished definitely.

In one embodiment of the present invention, a bias voltage is preferably applied to the gate electrode in reading out data from the ferroelectric film. Then, it is possible to increase the difference between a read current flowing where data in the first logical state is stored in the ferroelectric film and a read current flowing where data in the second logical state is stored in the ferroelectric film. As a result, the read accuracy improves.

In this particular embodiment, as data is repeatedly read out with the bias voltage applied, a disturb phenomenon is observed. That is to say, the other type of polarization, remaining in the ferroelectric film, gradually decreases toward zero. Even so, in reading out data, the first logical state may be defined as a state in which a current, substantially equal in amount to a current that flowed when the one type of polarization was written, flows between the source/drain regions. And the second logical state may be defined as a state in which a current in a predetermined range flows between the source/drain regions. The range is limited by a current that flowed when the other type of polarization was written and a current that flowed when the other type of polarization reached almost zero. In such an embodiment, the degradation of read accuracy, usually caused by the disturb phenomenon, is suppressible.

Another inventive semiconductor memory device includes a field effect transistor. The transistor includes: a semiconductor substrate; a ferroelectric film and a gate electrode stacked in this order over the substrate; and source/drain regions defined in the substrate and located on right- and left-hand sides of the gate electrode. The ferroelectric film exhibits a first or second type of polarization. The first type of polarization is created when a voltage is applied to the gate electrode so that the electrode has a positive potential level with respect to the substrate. The second type of polarization is created when another voltage is applied to the gate electrode so that the electrode has a negative potential level with respect to the substrate. Data in a first or second logical state is stored in the ferroelectric film. The first logical state is defined as a state in which one of the first and second types of polarization remains in the ferroelectric film to which zero voltage is being applied. The second logical state is defined as a state in which there is almost no remnant polarization in the ferroelectric film to which the zero voltage is being applied.

In this semiconductor device, data in the second logical state represents a state in which almost no polarization remains from the very beginning due to the disturb phenomenon. Accordingly, in reading out data, a read current value, corresponding to the data in the second logical state, becomes substantially constant. Thus, it is possible to tell the data in the second logical state from data in the first logical state even more definitely. As a result, the data read accuracy improves noticeably.

In one embodiment of the present invention, data in the first logical state and data in the second logical state are preferably written on the ferroelectric film by applying voltages with mutually different absolute values to the gate electrode.

In another embodiment of the present invention, the transistor may further include: a gate insulating film deposited on the substrate; and an intermediate gate electrode formed on the gate insulating film. The ferroelectric film may be deposited on the intermediate gate electrode, and the gate electrode may be formed on the ferroelectric film. In writing data, the first or second type of polarization is allowed to remain in the ferroelectric film by regulating a voltage applied between the gate electrode and the intermediate gate electrode. In reading data, a bias voltage is applicable to the gate electrode by making the intermediate gate electrode floating. In such an embodiment, the same effects are attainable for a semiconductor memory device including, as a memory cell, a field effect transistor with an MFMIS structure.

In still another embodiment, the transistor may further include: a gate insulating film deposited on the substrate; a first intermediate gate electrode formed on the gate insulating film; and a second intermediate gate electrode, which is formed separately from, and is electrically connected to, the first intermediate gate electrode. The ferroelectric film may be deposited on the second intermediate gate electrode. The gate electrode may be formed on the ferroelectric film. In writing data, the first or second type of polarization is allowed to remain in the ferroelectric film by regulating a voltage applied between the gate electrode and the second intermediate gate electrode. In reading data, a bias voltage is applicable to the gate electrode by making the first and second intermediate gate electrodes floating. In such an embodiment, the same effects are attainable for a semiconductor memory device including, as a memory cell, a field effect transistor substantially having an MFIS structure.

An inventive driving method is applicable to a semiconductor memory device including a field effect transistor. The transistor includes: a semiconductor substrate; a ferroelectric film and a gate electrode stacked in this order over the substrate; and source/drain regions defined in the substrate and located on right- and left-hand sides of the gate electrode. The ferroelectric film exhibits a first or second type of polarization. The first type of polarization is created when a voltage is applied to the gate electrode so that the electrode has a positive potential level with respect to the substrate. The second type of polarization is created when another voltage is applied to the gate electrode so that the electrode has a negative potential level with respect to the substrate. Data in a first or second logical state is read out from the ferroelectric film. The first logical state is defined as a state in which one of the first and second types of polarization remains in the ferroelectric film to which zero voltage is being applied. The second logical state is defined as a state in which either the other type of polarization or there is almost no remnant polarization in the ferroelectric film to which the zero voltage is being applied.

According to the inventive driving method, even if data in the second logical state, written on the ferroelectric film, is indefinite or if there is almost no remnant polarization in the ferroelectric film, data can be read out accurately with the first and second logical states distinguished definitely.

In one embodiment of the present invention, a bias voltage is preferably applied to the gate electrode in reading out data from the ferroelectric film. Then, it is possible to increase the difference between a read current flowing where data in the first logical state is stored in the ferroelectric film and a read current flowing where data in the second logical state is stored in the ferroelectric film. As a result, the read accuracy improves.

In this particular embodiment, as data is repeatedly read out with the bias voltage applied, a disturb phenomenon likely occurs. That is to say, the other type of polarization, remaining in the ferroelectric film, gradually decreases toward zero. Even so, in reading out data, the first logical state may be defined as a state in which a current, substantially equal in amount to a current that flowed when the one type of polarization was written, flows between the source/drain regions. And the second logical state may be defined as a state in which a current in a predetermined range flows between the source/drain regions. The range is limited by a current that flowed when the other type of polarization was written and a current that flowed when the other type of polarization reached almost zero. In such an embodiment, the degradation of read accuracy, usually caused by the disturb phenomenon, is suppressible.

In still another embodiment, the bias voltage applied to the gate electrode preferably has such a value as maximizing a difference between a current flowing between the source/drain regions when the data stored in the ferroelectric film is in the first logical state and a current flowing between the source/drain regions when the data stored in the ferroelectric film is in the second logical state.

Another inventive driving method is applicable to a semiconductor memory device including a field effect transistor. The transistor includes: a semiconductor substrate; a ferroelectric film and a gate electrode stacked in this order over the substrate; and source/drain regions defined in the substrate and located on right- and left-hand sides of the gate electrode. The ferroelectric film exhibits a first or second type of polarization. The first type of polarization is created when a voltage is applied to the gate electrode so that the electrode has a positive potential level with respect to the substrate. The second type of polarization is created when another voltage is applied to the gate electrode so that the electrode has a negative potential level with respect to the substrate. Data in a first or second logical state is stored in the ferroelectric film. The first logical state is defined as a state in which one of the first and second types of polarization remains in the ferroelectric film to which zero voltage is being applied. The second logical state is defined as a state in which there is almost no remnant polarization in the ferroelectric film to which the zero voltage is being applied. In reading out data from the ferroelectric film, a bias voltage is applied to the gate electrode.

According to the inventive driving method, data in the second logical state represents a state in which almost no polarization remains from the very beginning due to the disturb phenomenon. Accordingly, in reading out data, a read current value, corresponding to the data in the second logical state, becomes substantially constant. Thus, it is possible to tell the data in the second logical state from data in the first logical state even more definitely. As a result, the data read accuracy improves noticeably.

In this particular embodiment, the voltage applied to the gate electrode when data in the first logical state is written on the ferroelectric film preferably has an absolute value different from that of the voltage applied to the gate electrode when data in the second logical state is written on the ferroelectric film. In such an embodiment, data in the second logical state can easily represent a state in which almost no polarization remains from the very beginning due to the disturb phenomenon.

In still another embodiment, the transistor may further include: a gate insulating film deposited on the substrate; and an intermediate gate electrode formed on the gate insulating film. The ferroelectric film may be deposited on the intermediate gate electrode. The gate electrode may be formed on the ferroelectric film. In writing data, a voltage may be applied between the gate electrode and the intermediate gate electrode. And in reading data, a bias voltage may be applied to the gate electrode by making the intermediate gate electrode floating. In such an embodiment, the same effects are attainable for a semiconductor memory device including, as a memory cell, a field effect transistor with an MFMIS structure.

In an alternative embodiment, the transistor may further include: a gate insulating film deposited on the substrate; a first intermediate gate electrode formed on the gate insulating film; and a second intermediate gate electrode, which is formed separately from, and is electrically connected to, the first intermediate gate electrode. The ferroelectric film may be deposited on the second intermediate gate electrode. The gate electrode may be formed on the ferroelectric film. In writing data, a voltage may be applied between the gate electrode and the second intermediate gate electrode. And in reading data, a bias voltage may be applied to the gate electrode by making the first and second intermediate gate electrodes floating. In such an embodiment, the same effects are attainable for a semiconductor memory device including, as a memory cell, a field effect transistor substantially having an MFMIS structure.

In still another embodiment, in writing data in the second logical state on the ferroelectric film, the bias voltage applied to the gate electrode may be so regulated as to make a voltage supplied to the ferroelectric film substantially equal to a coercive voltage of the ferroelectric film. In such an embodiment, the data can be written while defining, as the second logical state, a state in which there is almost no remnant polarization in the ferroelectric film.

In yet another embodiment, either after data has been written on the ferroelectric film or before data is read out from the ferroelectric film, the intermediate gate electrode may be once grounded and then made floating. In this manner, unnecessary charge is removable from the intermediate electrode, thus improving the read accuracy.

In yet another embodiment, in reading out data that has been written on the ferroelectric film, the voltage applied to the gate electrode is preferably so regulated as to make a voltage supplied to the ferroelectric film lower than a coercive voltage of the ferroelectric film.

An inventive method for fabricating a semiconductor memory device includes the step of a) forming a memory cell including a field effect transistor. The transistor includes: a semiconductor substrate; a ferroelectric film and a gate electrode stacked in this order over the substrate; and source/drain regions defined in the substrate and located on right- and left-hand sides of the gate electrode. The ferroelectric film exhibits a first or second type of polarization. The first type of polarization is created when a voltage is applied to the gate electrode so that the electrode has a positive potential level with respect to the substrate. The second type of polarization is created when another voltage is applied to the gate electrode so that the electrode has a negative potential level with respect to the substrate. The method further includes the step of b) applying a voltage, which has the same polarity as a voltage applied for reading out data, to the ferroelectric film and then removing the former voltage so that the first type of polarization remains in the ferroelectric film. And the method further includes the step of c) heating the ferroelectric film for a predetermined period of time, thereby shifting hysteresis properties of the ferroelectric film in such a direction that a coercive voltage, needed to reverse the type of polarization from the first into the second, increases and making the hysteresis properties of the ferroelectric film asymmetric.

According to the inventive fabrication method, the polarization state of the ferroelectric film can be shifted toward the first logical state in advance. Thus, in reading out data, it is easier to tell data in the first logical state from data in the second logical state.

In one embodiment of the present invention, the method may further include the step of erasing the first type of polarization remaining in the ferroelectric film after the step b) has been performed.

DESCRIPTION OF THE PREFERRED EMBODIMENTS

EMBODIMENT 1

Structure of Ferroelectric FET

Figure 1:
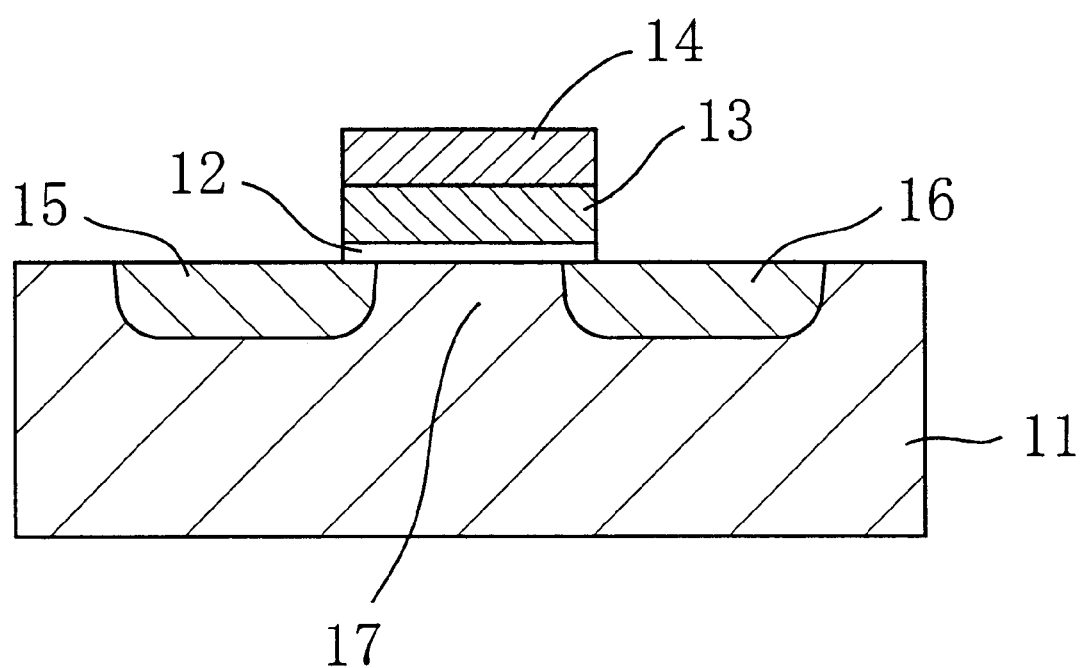
FIG. 1 is a cross-sectional view illustrating a ferroelectric FET with an MFIS structure according to a first embodiment of the present invention.

FIG. 1 is a cross-sectional view illustrating a ferroelectric FET with an MFIS structure according to a first embodiment of the present invention. As shown in FIG. 1, the FET includes silicon substrate 11, $SiO_2$ film 12, ferroelectric film 13, gate electrode 14 and source/drain regions 15 and 16. The $SiO_2$ film 12, ferroelectric film 13 and gate electrode 14 are stacked in this order on the substrate 11. The ferroelectric film 13 is made of a metal oxide such as lead zirconate titanate (PZT) or bismuth strontium tantalate (SBT). The gate electrode 14 is made of a conductor like platinum (Pt). The source/drain regions 15 and 16 are defined in the substrate 11 and located on right- and left-hand sides of the gate electrode 14. In this device, part of the substrate 11 under the $SiO_2$ film 12 serves as a channel region 17.

In the structure shown in FIG. 1, the ferroelectric film 13 exhibits electric spontaneous polarization of one of the following two types. More specifically, the electric dipole moment in the film 13 is either upward or downward depending on the polarity of a voltage applied between the gate electrode 14 and substrate 11. As used herein, the "upward electric dipole moment" refers to the electric moment of electric dipoles showing positive polarity at their upper end, while the "downward electric dipole moment" refers to the electric moment of electric dipoles showing positive polarity at their lower end. The ferroelectric film 13 also shows dielectric hysteresis. That is to say, even after the voltage applied is removed, the polarization of either type remains in the film 13. Thus, the film 13 exhibits one of these two different types of remnant polarization while zero voltage is being applied to the gate electrode 14. As a result, the channel region 17 of the ferroelectric FET enters one of two different states with mutually different potential depths corresponding to these two different types of remnant polarization. On the other hand, the source-drain resistance of the ferroelectric FET changes with the potential depth in the channel region 17. Accordingly, it depends on the type of remnant polarization exhibited by the ferroelectric film 13 whether the source-drain resistance becomes relatively high or relatively low. And one of these two different states, corresponding to the high and low source-drain resistance values, respectively, is retained (or stored) so long as the ferroelectric film 13 keeps its remnant polarization. This is why a nonvolatile memory device is realized by a ferroelectric FET like this. For example, one state assumed by the ferroelectric film 13 with the down remnant polarization may be associated with data "1" (i.e., the first logical state as defined in the claims). The other state assumed by the ferroelectric film 13 with the up remnant polarization may be associated with data "0" (i.e., the second logical state as defined in the claims). On this supposition, the ferroelectric FET may be used as a memory cell.

Figure 10:
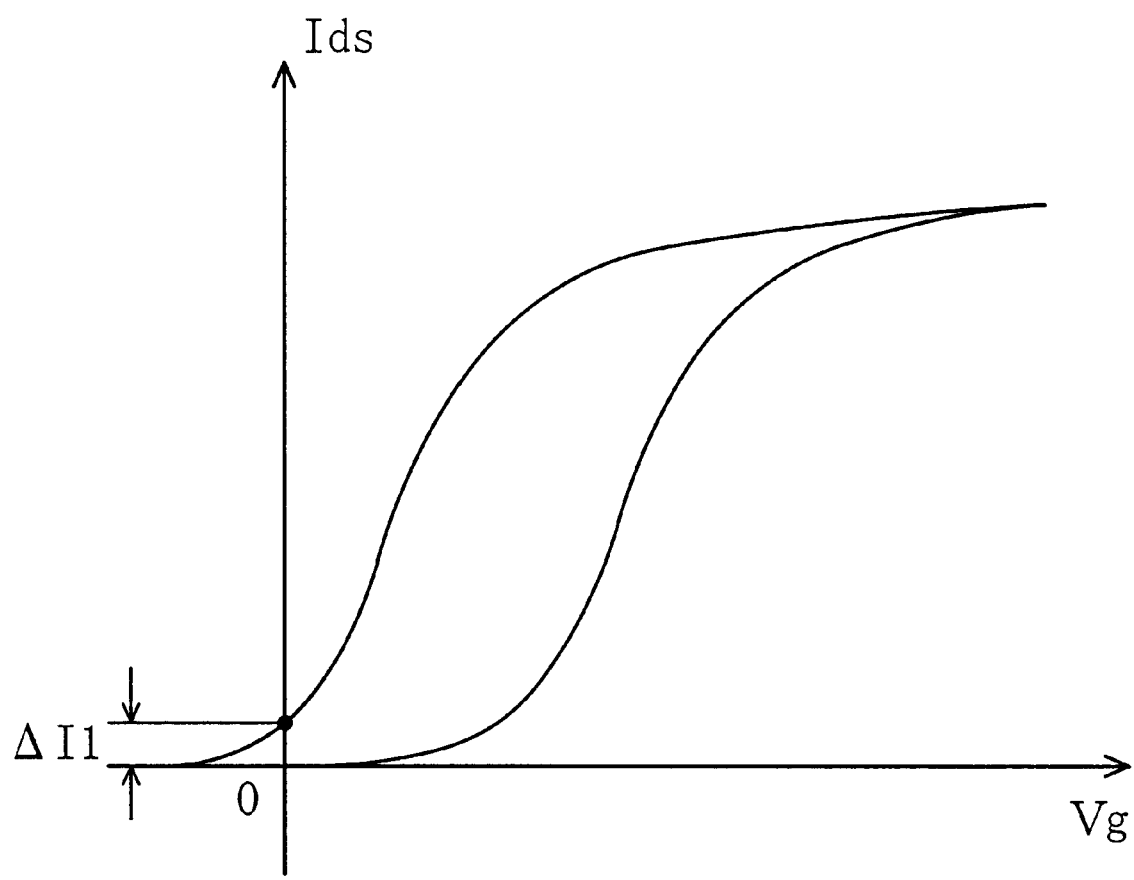
FIG. 10 is a graph illustrating a relationship between the voltage applied to the gate electrode of a ferroelectric FET and the source-drain current.

However, as already described for the prior art, according to the known method of reading data with no bias applied to the gate electrode 14, the difference $\Delta I1$ in the amount of read current flowing between the data "1" and data "0" states is small (see FIG. 10). For that reason, according to this embodiment, a bias is applied to the gate electrode 14 during reading.

How to Set Gate Bias

Figure 2:
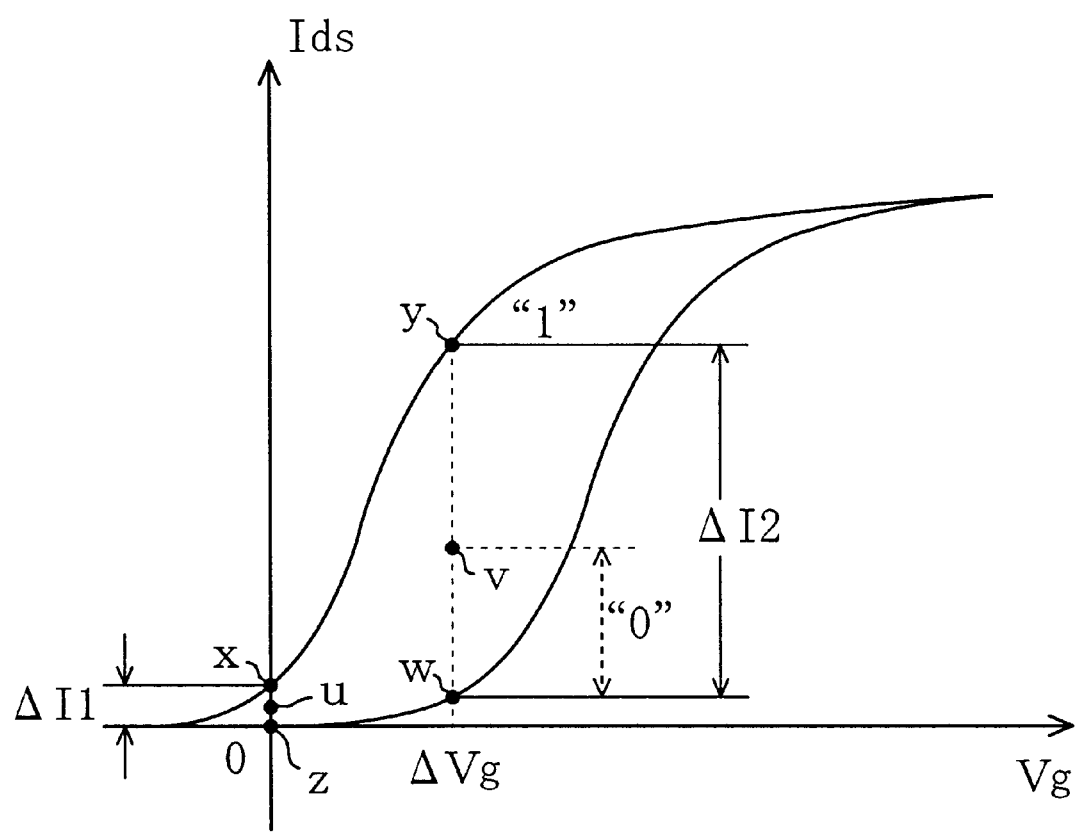
FIG. 2 is a graph illustrating how to set a gate bias in a read operation according to the first embodiment.

FIG. 2 is a graph showing how to set a gate bias $\Delta Vg$ (i.e., a voltage applied to the gate electrode 14) in a read operation according to the first embodiment. As already described, the source-drain current Ids of the ferroelectric FET depends on the gate bias as shown in FIG. 10. In this embodiment, the gate bias Vg is set to such a value $\Delta Vg$ as maximizing the difference in the amount of read current flowing between the data "1" and data "0" states in accordance with the gate bias dependence of the source-drain current Ids. In FIG. 2, the maximum read current difference is identified by $\Delta I2$. That is to say, according to this embodiment, the gate voltage Vg is set to a value greater than zero volt by $\Delta Vg$ during reading. In other words, an offset voltage of $\Delta Vg$ is applied to the gate electrode 14 to increase the SNR of a read signal.

Disturb Phenomenon

Figure 9A:
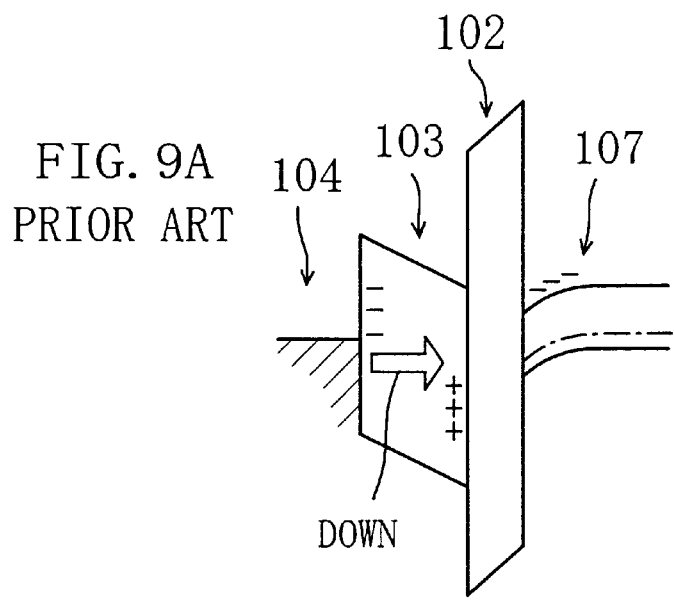
FIGS. 9A, 9B and 9C are energy band diagrams illustrating respective energy band states corresponding to down, up and almost zero remnant polarization exhibited by a ferroelectric film in the known ferroelectric FET.
Figure 9B:
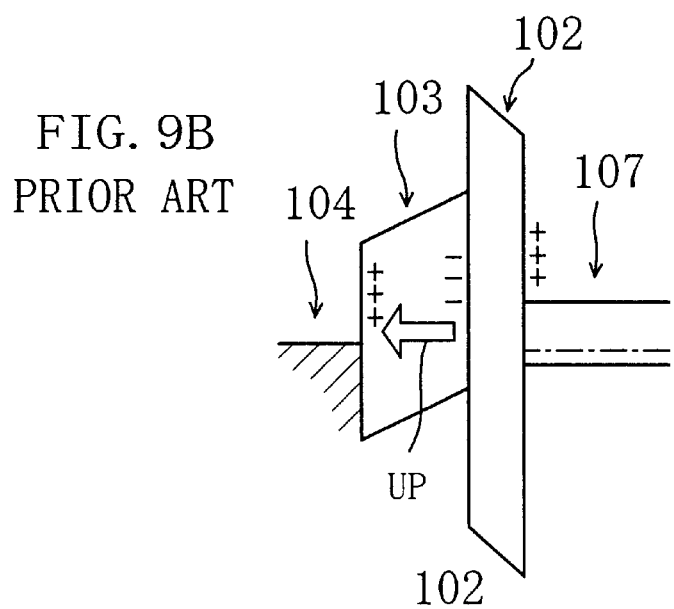
Figure 9C:
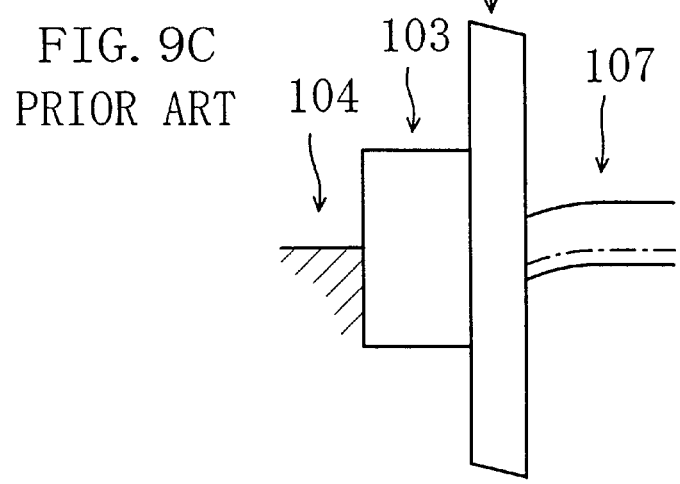

In this method, however, the offset voltage $\Delta Vg$ is applied to the gate electrode 14 of the ferroelectric FET every time a read operation is performed. For example, suppose a positive offset voltage $\Delta Vg$ is applied to the gate electrode. In that case, if the remnant polarization is downward (i.e., in the data "1" state), then the direction of the remnant polarization is the same as the direction of polarization induced by an electric field created by the gate bias. Accordingly, the remnant polarization is not affected by the gate bias. However, if the remnant polarization is upward (i.e., in the data "0" state), then the direction of the remnant polarization is opposite to the direction of polarization induced by an electric field created by the gate bias. In that case, every time the offset voltage $\Delta Vg$ is applied to the gate electrode, the remnant polarization in the ferroelectric film decreases little by little. So if the read operation is repeatedly performed on the ferroelectric film many times, the remnant polarization in the ferroelectric film will eventually reach almost zero as shown in FIG. 9C. A phenomenon like this, or the unintentional, gradual data loss caused by repeatedly applying, as a gate voltage, a voltage creating an electric field in such a direction as weakening the remnant polarization, is called a "disturb phenomenon".

Figure 11:
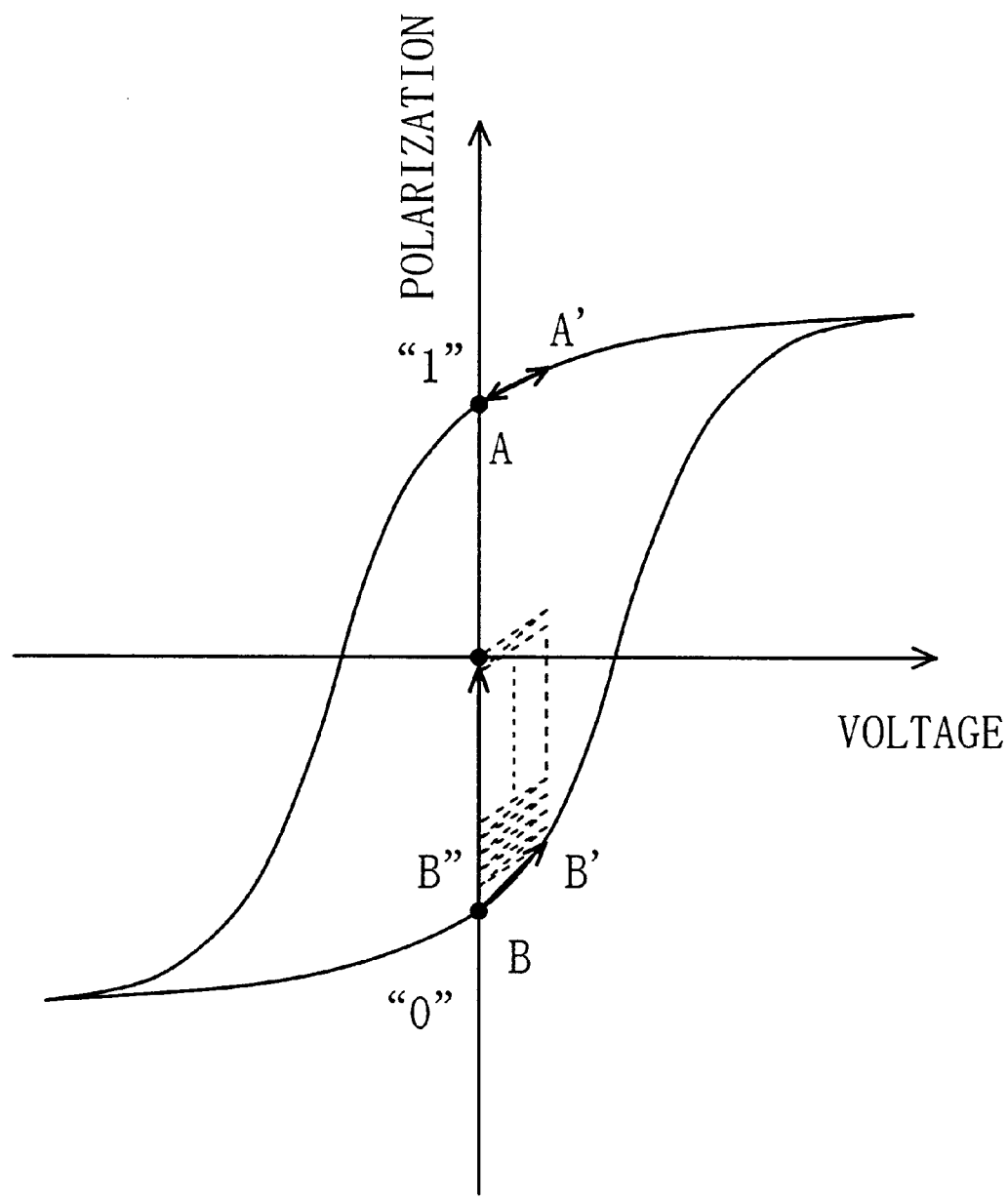
FIG. 11 is a hysteresis loop illustrating a disturb phenomenon.

FIG. 11 is a hysteresis loop illustrating the disturb phenomenon. In FIG. 11, the ordinate represents the polarizability, while the abscissa represents the gate bias, or the voltage applied to the gate electrode. Also, in FIG. 11, the down polarization is regarded as a positive one. As shown in FIG. 11, in the initial state where zero voltage is applied to the gate electrode 14, the down remnant polarization (in the data "1" state) is represented by a point A of the hysteresis loop. On the other hand, in this initial state, the up remnant polarization (in the data "0" state) is represented by a point B of the hysteresis loop. If a positive gate bias is applied to the gate electrode 14 over the ferroelectric film 13 with the initial remnant polarization represented by the point A or B, then the following behavior is observed. Where the initial remnant polarization is represented by the point A, the positive gate bias applied increases the polarization from the point A to a point A' along the hysteresis loop even if the gate bias is lower than the coercive voltage of the ferroelectric film. When the read operation is finished after that, the gate bias is removed (or reset to zero). Then, the polarization represented by the point A' will decrease to the initial polarization represented by the point A. On the other hand, where the initial remnant polarization is represented by the point B, the positive gate bias applied decreases the polarization from the point B to a point B' along the hysteresis loop even if the gate bias is lower than the coercive voltage. When the read operation is finished after that, the gate bias is also removed (or reset to zero). In this case, however, the polarization represented by the point B' will not increase to the initial polarization represented by the point B, but will change to the polarization represented by another point B". That is to say, the offset voltage $\Delta Vg$ applied to the gate electrode (i.e., the gate bias) decreases the up polarization slightly. Accordingly, the greater the number of times of the read operation, the weaker the resultant up polarization as indicated by the dotted lines in FIG. 11. And the up polarization will reach almost zero in the end.

As the remnant polarization decreases little by little due to the disturb phenomenon, the channel potential of the known ferroelectric FET, where data "0" has been stored, will get, as shown in FIG. 9C, closer to the channel potential of the FET where data "1" has been stored. Accordingly, the source-drain current Ids, corresponding to the data "0" state, gradually changes from its initial value. This is an unfavorable phenomenon that should be eliminated in designing a read circuit.

Read Operation

In contrast, according to this embodiment, an offset voltage $\Delta Vg$, causing down polarization in the ferroelectric film 13, is applied to the gate electrode 14 in reading out data from the ferroelectric FET. Accordingly, during the read operation, the potential created near the surface of the channel region 17 in the ferroelectric FET of the present invention is different from the known ferroelectric FET as will be described below.

Figure 3A:
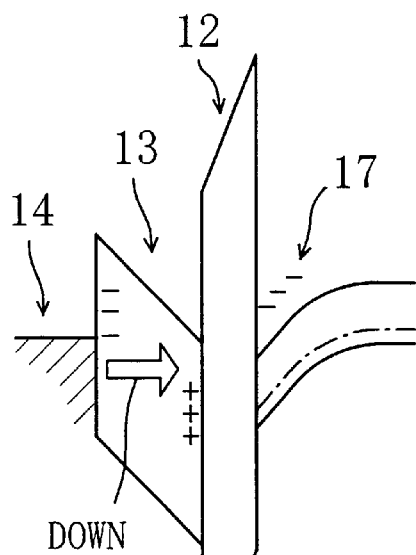
FIGS. 3A, 3B and 3C are energy band diagrams illustrating respective energy band states corresponding to down, up and almost zero remnant polarization exhibited by a ferroelectric film in the ferroelectric FET of the first embodiment during a read operation.
Figure 3B:
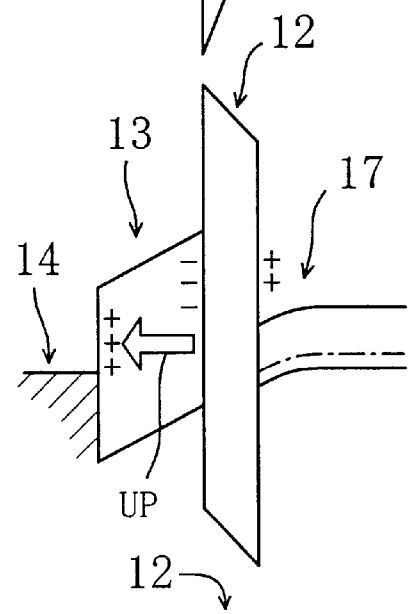
Figure 3C:
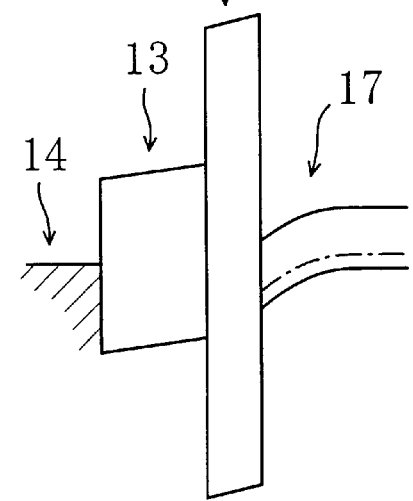

FIGS. 3A, 3B and 3C are energy band diagrams illustrating respective energy band states corresponding to down, up and almost zero remnant polarization exhibited by the ferroelectric film 13 during a read operation. Each of these diagrams is illustrated for a cross section passing the gate electrode 14, ferroelectric film 13, $SiO_2$ film 12 and channel region 17. In the example illustrated in FIGS. 3A, 3B and 3C, the substrate 11 is a p-type silicon substrate, the source/drain regions 15 and 16 are n-type semiconductor regions, and the arrows indicate the polarization directions of the ferroelectric film 13.

In this embodiment, the polarization is also created in the ferroelectric film 13 as in the prior art. Accordingly, while zero voltage is applied to the gate electrode 14, the energy band states on the cross section passing the gate electrode 14, ferroelectric film 13, $SiO_2$ film 12 and channel region 17 are also as illustrated in FIGS. 9A through 9C.

In reading data, an offset voltage $\Delta Vg$ is applied to the gate electrode 14 of the ferroelectric FET shown in FIG. 1 so that the electrode 14 has a positive or negative potential level with respect to the substrate 11. In this case, the potential difference $\Delta Vg$ produced between the electrode 14 and substrate 11 is allotted at a certain ratio to the ferroelectric and $SiO_2$ films 13 and 12 located between the electrode 14 and substrate 11.

Suppose the remnant polarization is downward (i.e., in the data "1" state). In that case, the offset voltage $\Delta Vg$ applied to the gate electrode 14 intensifies the polarization. Accordingly, the lower end of the ferroelectric film 13 comes to show positive polarity, thereby bending the energy bands of the ferroelectric film 13, $SiO_2$ film 12 and channel region 17 as shown in FIG. 3A. In such a situation, part of the channel region 17 near the interface between the channel region 17 and $SiO_2$ film 12 changes its conductivity type from p- into n-type. That is to say, negative ions are densely concentrated at that part of the channel region 17. As a result, a depletion layer expands to the deeper part of the substrate 11, and the potential level at that part of the channel region 17 near the Si—$SiO_2$ interface becomes lower than the ground level. Consequently, a strong inversion layer is formed in the channel region 17 and the ferroelectric FET has a current value associated with its ON state.

On the other hand, if the remnant polarization is upward (i.e., in the data "0" state), the offset voltage $\Delta Vg$ applied to the gate electrode 14 weakens the polarization. Thus, although an electric field is created in the ferroelectric film 13, the field intensity at the lower end of the film 13 with negative polarity is not so great. Accordingly, the energy bands of the ferroelectric film 13, $SiO_2$ film 12 and channel region 17 are bent as shown in FIG. 3B. In such a situation, part of the channel region 17 near the Si—$SiO_2$ interface comes to have a lower potential level. As a result, a weak inversion layer is formed in the channel region 17.

When the remnant polarization reaches almost zero due to the disturb phenomenon, the offset voltage $\Delta Vg$ applied to the gate electrode 14 bends the energy bands of the ferroelectric film 13, $SiO_2$ film 12 and channel region 17 as shown in FIG. 3C. In this case, the potential level at the edge of the conduction band is bent downward in that part of the channel region 17 near the Si—$SiO_2$ interface. As a result, an inversion layer, a little stronger than that shown in FIG. 3B, is formed in the channel region 17.

In this manner, the potential level at that part of the channel region 17 near the surface changes depending on the direction of the remnant polarization. Accordingly, when a potential difference is created between the source/drain regions 15 and 16 as a pair of n-type semiconductor regions, the resultant source-drain current flowing also changes with the direction of the polarization.

Suppose the state illustrated in FIG. 3A is defined as the data "1" state. In such a state, a strong inversion layer is formed. Accordingly, the source-drain resistance is low and a large amount of current flows as indicated by the point y in FIG. 2. On the other hand, regarding the state illustrated in FIG. 3B as the data "0" state, the source-drain resistance is relatively high in such a state and a small amount of current flows as indicated by the point w in FIG. 2. Thus, by measuring the source-drain current in this manner, it is possible to know, by the current value obtained, whether the ferroelectric FET is in the data "1" state or "0" state.

Also, in the state illustrated in FIG. 3C, the polarization remaining in the ferroelectric film 13 reaches almost zero, and an inversion layer, slightly stronger than that illustrated in FIG. 3B, is formed. As a result, an intermediate amount of current flows as indicated by the point v in FIG. 2. This current value, represented by the point v, is much smaller than that represented by the point y. Accordingly, it is relatively easy to tell the current value represented by the point w from that represented by the point v clearly.

How to Define Logical State for Data

Accordingly, a nonvolatile memory device, including the ferroelectric FET of this embodiment, performs a read operation with an offset voltage (i.e., gate bias) ΔVg applied to the gate electrode 14. During this read operation, the source-drain current changes its value due to the disturb phenomenon as shown in FIG. 11. In this embodiment, current values, falling within a predetermined range as illustrated by the hysteresis loop shown in FIG. 2, are regarded as representing data "0". The range is defined between a current value associated with the up polarization state as shown in FIG. 3B and a current value associated with the zero polarization state, caused by the disturb phenomenon, as shown in FIG. 3C. More specifically, the range is defined between the points w and v shown in FIG. 2. That is to say, any current value, equal to or smaller than that associated with the point v shown in FIG. 2, is regarded as representing data "0". It should be noted that a current value associated with the down polarization state as shown in FIG. 3A (i.e., associated with the point y shown in FIG. 2) is also regarded as representing the data "1" state as in the prior art.

The following Table 1 represents correlations between the logical states, associated with the source-drain resistance, and the directions of polarization for the prior art and inventive ferroelectric FETs:

| Polarization | Known FET | Inventive FET ① | Inventive FET ② |
|---|---|---|---|
| Down | "1" (ON) | "1" (large ON current) | "1" (ON) |
| Up | "0" (OFF) | "0" (small ON current) | "0" (OFF) |
| Zero | Indefinite | "0" (intermediate ON current) | "0" (OFF) |

The inventive ferroelectric FET (identified by ① in Table 1) is different from the known ferroelectric FET in the following respect. Specifically, in the zero polarization state caused by the disturb phenomenon, just a weak inversion layer is formed in the channel region 107 of the known ferroelectric FET (see FIG. 9C). In the inventive ferroelectric FET on the other hand, the offset voltage ΔVg applied to the gate electrode 14 does create polarization in the ferroelectric film to form a relatively strong inversion layer in the channel region 17 (see FIG. 3C). Accordingly, in the zero polarization state caused by the disturb phenomenon, the known ferroelectric FET must tell current values associated with the points u and x shown in FIG. 2 from each other to read out data accurately. Actually, though, it is very difficult to tell the current values associated with these points u and x from each other. For that reason, according to the known technique, the logical state of the read data is indefinite in such a situation. In contrast, the inventive ferroelectric FET has only to tell the current value associated with the point y from the current values falling within the wide range defined by the points w and v as shown in FIG. 2. Accordingly, the inventive FET can associate the read data with one of the two possible logical states much more clearly. That is to say, according to the present invention, even after the up polarization has been lost due to the disturb phenomenon, the logical state can be decided definitely.

In this embodiment, the ferroelectric FET as a memory cell defines a state of the ferroelectric film 13 with the down remnant polarization as the data "1" state and another state of the ferroelectric film 13 with the up or almost zero remnant polarization as the data "0" state. Alternatively, a state of the ferroelectric film 13 with the down or almost zero remnant polarization may be regarded as the data "0" state and another state of the ferroelectric film 13 with the up polarization may be regarded as the data "1" state.

Also, these data states associated with the directions of remnant polarization are arbitrarily definable and so interchangeable. Accordingly, the ferroelectric FET as a memory cell may regard a state of the ferroelectric film 13 with the down remnant polarization as the data "0" state and another state of the ferroelectric film 13 with the up or almost zero remnant polarization as the data "1" state.

Optionally, the $SiO_2$ film 12 may be omitted.

Also, in the inventive FET identified by ② in Table 1, a built-in potential may be regulated in such a manner that the source-drain current Ids flows, or the ferroelectric FET turns ON, only in the down remnant polarization state. That is to say, the potential may be regulated appropriately so that in the up or zero remnant polarization state, no source-drain current Ids flows in the ferroelectric FET (i.e., the FET turns OFF) even if the bias voltage is applied to the gate electrode 14. Even in this alternative embodiment, where down remnant polarization is created (i.e., in the data "1" state) when data is read out, the amount of the current Ids flowing is much greater compared to the prior art. Accordingly, it is possible to avoid the unwanted situation where this down polarization state is not so much different from the up or zero polarization state (i.e., data "0" state).

EMBODIMENT 2

Figure 4:
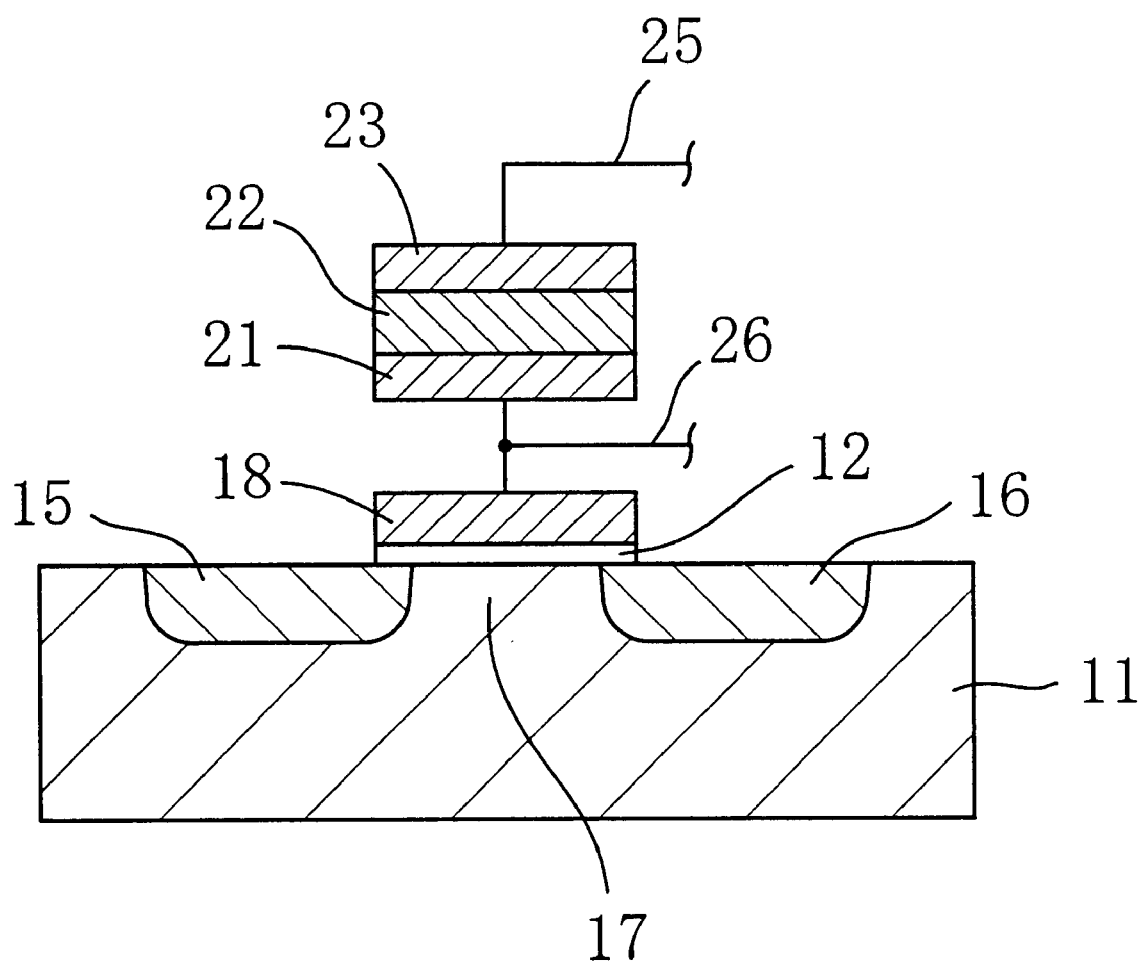
FIG. 4 is a cross-sectional view illustrating a memory cell for a semiconductor memory device according to a second embodiment of the present invention.

FIG. 4 is a cross-sectional view illustrating a memory cell for a semiconductor memory device according to a second embodiment of the present invention. The memory cell of the second embodiment may be regarded as a ferroelectric FET with a so-called MFMIS structure.

As shown in FIG. 4, the ferroelectric FET includes p-type silicon substrate 11, $SiO_2$ film (gate insulating film) 12, first intermediate gate electrode 18 and n-type source/drain regions 15 and 16. The $SiO_2$ film 12 and first intermediate gate electrode 18 are stacked in this order on the substrate 11. The first intermediate gate electrode 18 is made of a conductor like polysilicon. The source/drain regions 15 and 16 are defined in the substrate 11 and located on right- and left-hand sides of the electrode 18. And part of the substrate 11 under the $SiO_2$ film 12 serves as a channel region 17. The ferroelectric FET further includes second intermediate gate electrode 21, ferroelectric film 22 and control gate electrode 23, which are stacked in this order over the first intermediate gate electrode 18. The second intermediate gate electrode 21 is made of Pt, for example. The ferroelectric film 22 is made of a metal oxide such as lead zirconate titanate (PZT) or bismuth strontium tantalate (SBT) and has a thickness of about 200 nm. The control gate electrode 23 is made of a conductor like Pt and faces the second intermediate gate electrode 21 with the ferroelectric film 22 interposed therebetween. The control gate electrode 23 is connected to a first line 25, while the first and second intermediate gate electrodes 18 and 21 are connected in common to a second line 26.

Suppose the first and second intermediate gate electrodes 18 and 21 together forms a single electrode. Then, this structure may be regarded as an MFMISFET, in which the first and second intermediate gate electrodes 18 and 21 are provided as an intermediate gate electrode between the ferroelectric film 13 and $SiO_2$ film 12 of the ferroelectric FET shown in FIG. 1. It should be noted that the first and second intermediate gate electrodes 18 and 21 may be either combined together or separate ones as shown in FIG. 4.

Where the ferroelectric film 22 is made of SBT and has a thickness of about 200 nm, the coercive voltage of the ferroelectric film 22 is about 1 V.

The ferroelectric FET of the second embodiment has a structure different from the counterpart of the first embodiment in the following respects. Specifically, in the ferroelectric FET of the second embodiment, a voltage can be directly applied through the first and second lines 25 and 26, which are connected to the control and second intermediate gate electrodes 23 and 21, respectively, to change the polarization state of the ferroelectric film 22. Also, in the FET of the second embodiment, the potential level at the first intermediate gate electrode 18 can be determined using the second line 26 before a read operation is started.

The FET of the second embodiment also operates differently from the counterpart of the first embodiment. Specifically, in the second embodiment, the voltage supplied to the ferroelectric film 22 should have its absolute value changed depending on whether data should be written on the ferroelectric film 22 to create the down or up remnant polarization (i.e., data "1" or "0").

For the ferroelectric FET of this second embodiment, no energy band diagrams are illustrated. However, supposing the first and second intermediate gate electrodes 18 and 21 are combined in the structure shown in FIG. 4, the only additional component the structure of the second embodiment has is a conductor member interposed between the ferroelectric and $SiO_2$ films 13 and 12. Thus, almost the same energy band diagrams as those illustrated in FIGS. 3A through 3C are applicable to the second embodiment. That is to say, the FET of the second embodiment performs a read operation substantially in the same way as the first embodiment. However, unlike the first embodiment, a voltage should be applied according to the second embodiment between the control and second intermediate gate electrodes 23 and 21 to create polarization in the ferroelectric film 22.

Figure 5:
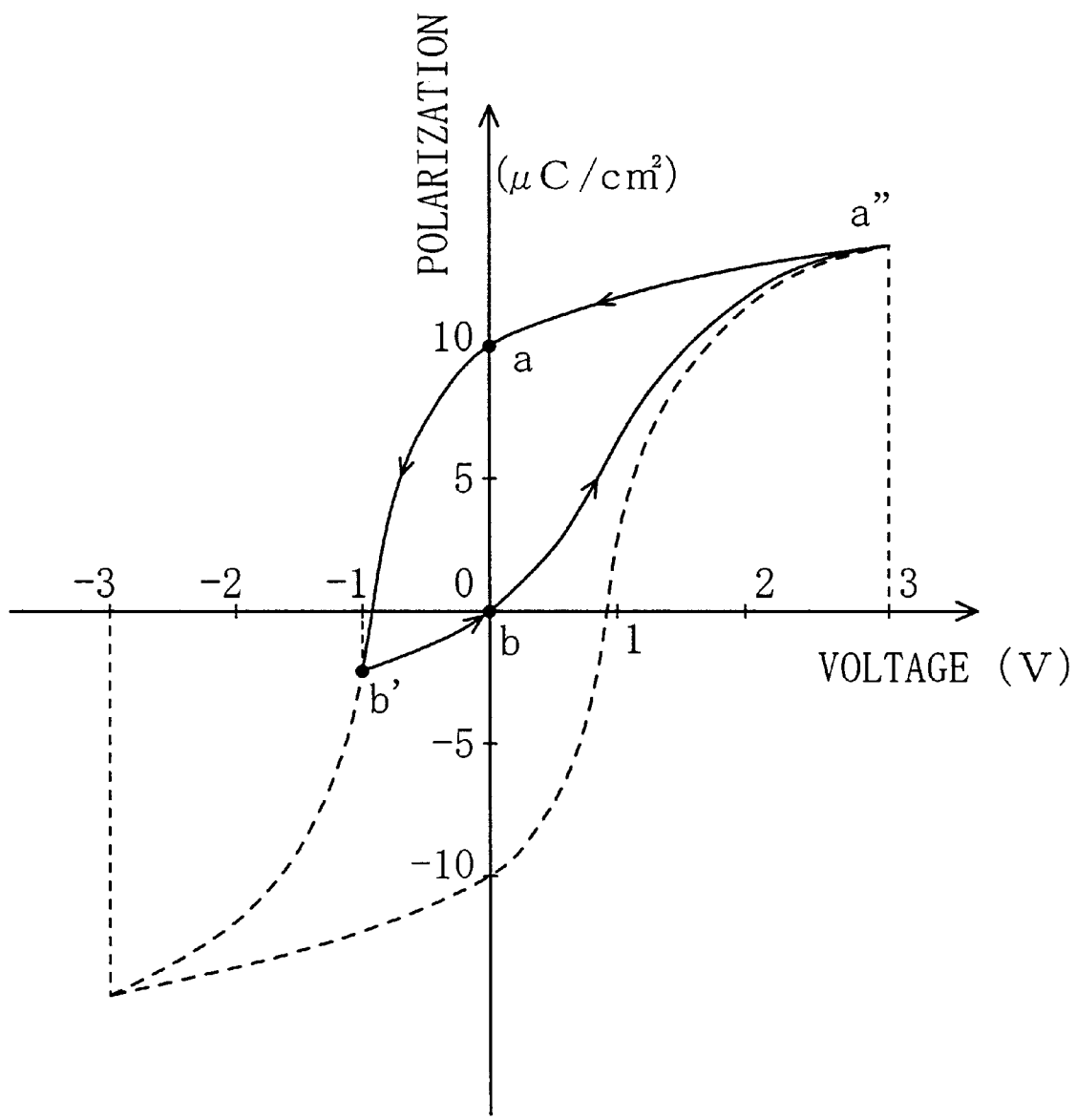
FIG. 5 is a hysteresis loop showing a relationship between the voltage and the polarization and illustrating a data write operation according to the second embodiment.

FIG. 5 is a hysteresis loop showing a relationship between the voltage and the polarization and illustrating a data write operation according to the second embodiment. In FIG. 5, the abscissa represents the voltage applied between the control and second intermediate gate electrodes 23 and 21, while the ordinate represents the polarization created in the ferroelectric film 22. In FIG. 5, the down polarization is regarded as a positive one. In the following description, the silicon substrate 11 is supposed to be always at the ground level.

As shown in FIG. 5, before data is written, the polarization in the ferroelectric film 22 is almost zero. Accordingly, the polarization is located near the origin O of the graph. In writing data "1" on this ferroelectric film 22, the ground potential may be applied to the second intermediate gate electrode 21 through the second line 26, while a voltage of 3 V may be applied to the control gate electrode 23 through the first line 25. Then, the polarization increases from the origin O to the point a" along the upward solid-line arrow. Thereafter, once the voltage, applied to the control gate electrode 23 through the first line 25, is removed, the polarization decreases from the point a" to the point a. As a result, a charge of about 10 $\mu C/cm^2$ (i.e., remnant polarization) is retained as data "1" in the ferroelectric film 22 at the zero voltage.

To rewrite the data "1" into data "0" after that, a voltage of about −1 V, not a voltage of −3 V needed for reversing the polarization into a negative saturated polarization, is applied to the control gate electrode 23 through the first line 25. According to the present invention, the data "0" represents a range between the negative saturated polarization state (with a charge of about −10 $\mu C/cm^2$) and almost zero polarization state (with a charge of about 0 $\mu C/cm^2$). Accordingly, the polarization representing the data "0" does not have to be decreased to about −10 $\mu C/cm^2$ but has only to be decreased to around 0 $\mu C/cm^2$ from the beginning. For that reason, when the voltage of about −1 V is applied to the control gate electrode 23 through the first line 25, the polarization changes from the point a into the point b' as shown in FIG. 5. This operation is also realized by applying a ground potential to the control gate electrode 23 through the first line 25 and a voltage of 1 V to the second intermediate gate electrode 21 through the second line 26, respectively. Thereafter, once the voltage, applied to the control gate electrode 23 through the first line 25, is removed, the polarization increases from the point b' to the point b. As a result, a charge of about 0 $\mu C/cm^2$ is retained as the data "0" in the ferroelectric film 22 at the zero voltage.

In the foregoing example, when a negative voltage, which has been applied to the ferroelectric film 22 that had a positive polarization, is removed, the polarization created in the ferroelectric film 22 (i.e., remnant polarization) reaches almost zero. Accordingly, a voltage substantially equal in magnitude to the negative voltage (i.e., the coercive voltage) may be applied according to this embodiment to rewrite the data from "1" into "0".

Alternatively, a relatively small negative voltage, which has an absolute value greater than that of the coercive voltage (i.e., −1 V in this embodiment) but has not reached a saturation state, may be applied between the control and second intermediate gate electrodes 23 and 21. Even so, the read accuracy improves to a certain extent as will be described later.

In writing data "0" on the ferroelectric film 22 on which no data has been written yet, the coercive voltage (i.e., about −1 V in FIG. 5) is also preferably applied to the ferroelectric film 22.

After the data has been written, a ground potential is applied to the second intermediate gate electrode 21 through the second line 26, thereby fixing the potential level at the first intermediate gate electrode 18 connected to the second intermediate gate electrode 21. Subsequently, using a switching transistor, for example, the second line 26, connected to the second intermediate gate electrode 21, is electrically disconnected from peripheral circuits (not shown).

Alternatively, just before data is read out, a ground potential may be applied to the second intermediate gate electrode 21 through the second line 26, thereby fixing the potential level at the first intermediate gate electrode 18 connected to the second intermediate gate electrode 21. This operation is performed to remove unnecessary charge that has been accumulated in the first intermediate gate electrode 18 as a result of preceding write and read operations or leakage current in a standby state. Subsequently, using a switching transistor, for example, the second line 26, connected to the second intermediate gate electrode 21, is electrically disconnected from peripheral circuits (not shown). Thereafter, to read out data, a read voltage VR, corresponding to the offset voltage ΔVg as described for the first embodiment, is applied to the control gate electrode 23 through the first line 25. This read voltage VR is divided into a voltage supplied to the ferroelectric film 22 and a voltage supplied to the $SiO_2$ film 12. In this case, if the polarization in the ferroelectric film 22 is downward (i.e., in the data "1" state), then the direction of polarization created by the voltage supplied to the ferroelectric film 22 is the same as that of the polarization (or charge) retained in the film 22. Accordingly, as described for the first embodiment, neither the direction nor magnitude of the polarization changes even after the read voltage VR has been removed.

However, it is a different story if the polarization in the ferroelectric film 22 is upward (i.e., in the data "0" state). In that case, the direction of the polarization created by the voltage applied to the ferroelectric film 22 is opposite to that of the polarization (i.e., charge) stored in the ferroelectric film 22. Thus, according to the writing method of the first embodiment, the ferroelectric film 22 is subject to the disturb phenomenon upon the application of the read voltage VR. As a result, the polarization is lost little by little and the source-drain current Ids representing the data "0" state also changes correspondingly.

In contrast, according to the writing method of the second embodiment, a polarization of about 0 $\mu C/cm^2$ has been retained as data "0" from the beginning. Furthermore, according to the second embodiment, the read voltage VR applied to the control gate electrode 23 through the first line 25 is set so that the voltage supplied to the ferroelectric film 22 does not exceed the coercive voltage. Accordingly, the polarization is not lost due to the disturb phenomenon or the data "0" state does not switch into the data "1" state unexpectedly. Thus, even if the data "0" is read out repeatedly, the source-drain current Ids does not change. Specifically, the ratio of the voltage supplied to the ferroelectric film 22 to the voltage supplied to the $SiO_2$ film 12 is determined by the ratio of a capacitance formed by the second intermediate gate electrode 21, ferroelectric film 22 and control gate electrode 23 to a capacitance formed by the first intermediate gate electrode 18, $SiO_2$ film 12 and substrate 11. By adjusting this capacitance ratio and read voltage VR, the voltage supplied to the ferroelectric film 22 during reading can be equal to or smaller than the coercive voltage that switches the polarization state in the ferroelectric film 22.

To save the data written, the first and second lines 25 and 26, connected to the control and second intermediate gate electrodes 23 and 21, respectively, are grounded to supply zero bias to the ferroelectric film 22 at the last stage of the preceding data write operation. Then, while the data is saved, the polarization will not be altered by the bias.

Thus, according to the present invention, data is written, rewritten, saved or read by associating the data "1" state with the down remnant polarization and the data "0" state with the up, non-saturated remnant polarization, respectively. As a result, in the data "0" state, the read current does not change so much due to the disturb phenomenon, and the read accuracy improves.

In particular, by associating the data "0" state with almost zero polarization as is done in this embodiment, the read accuracy improves significantly.

In the foregoing embodiment, write and rewrite operations are performed so that the polarization becomes substantially zero in the data "0" state. However, the present invention is not limited to such a specific embodiment, but may be modified so that the polarization becomes almost zero in the data "1" state.

The second embodiment of the present invention is applied to a ferroelectric FET with an MFMIS structure. Alternatively, the same effects are attainable even if the present invention is applied to a ferroelectric FET with the MFIS structure shown in FIG. 1.

Also, in the second embodiment, the dielectric capacitor, formed by the first intermediate gate electrode 18, $SiO_2$ film 12 and substrate 11, has a constant capacitance. However, the ferroelectric capacitor, formed by the control gate electrode 23, ferroelectric film 22 and second intermediate gate electrode 21, has a variable capacitance. In the example shown in FIG. 5, a capacitance associated with the point a is different from a capacitance associated with the point b. This is because the capacitance of a capacitor corresponds to the slope of a hysteresis loop. Also, the voltage applied between the control gate electrode 23 and substrate 11 is allotted to the dielectric and ferroelectric capacitors. Accordingly, the greater the capacitance of the ferroelectric capacitor, the smaller the fraction of the voltage that has been applied between the control gate electrode 23 and silicon substrate 11 and then allotted to the ferroelectric capacitor. In this manner, as the ferroelectric capacitor changes its capacitance, a variable fraction of the voltage applied to the control gate electrode 23 is allotted. As a result, the current value also changes correspondingly, and it is even easier to determine the logical state of data.

EMBODIMENT 3

Next, a third embodiment of the present invention, relating to countermeasures against the imprint degradation, will be described.

The second embodiment of the present invention can suppress the change in bias voltage due to the disturb phenomenon during reading. However, as described for the prior art, the imprint degradation makes it difficult to prevent the level of the source-drain current Ids from changing from the initial one if data is read out after a long time of retention.

Thus, according to the third embodiment, data is once written so that the polarization of the ferroelectric film 22 is represented by the point a shown in FIG. 5 (i.e., in the data "1" state), and imprinting of the data "1" state is induced in advance in this polarization state. That is to say, unlike the known fabrication process of a semiconductor memory device, the device of the third embodiment is fabricated by performing not just the process steps normally required for a semiconductor memory device but the process step of writing data "1" and inducing the imprint degradation on purpose.

Figure 6:
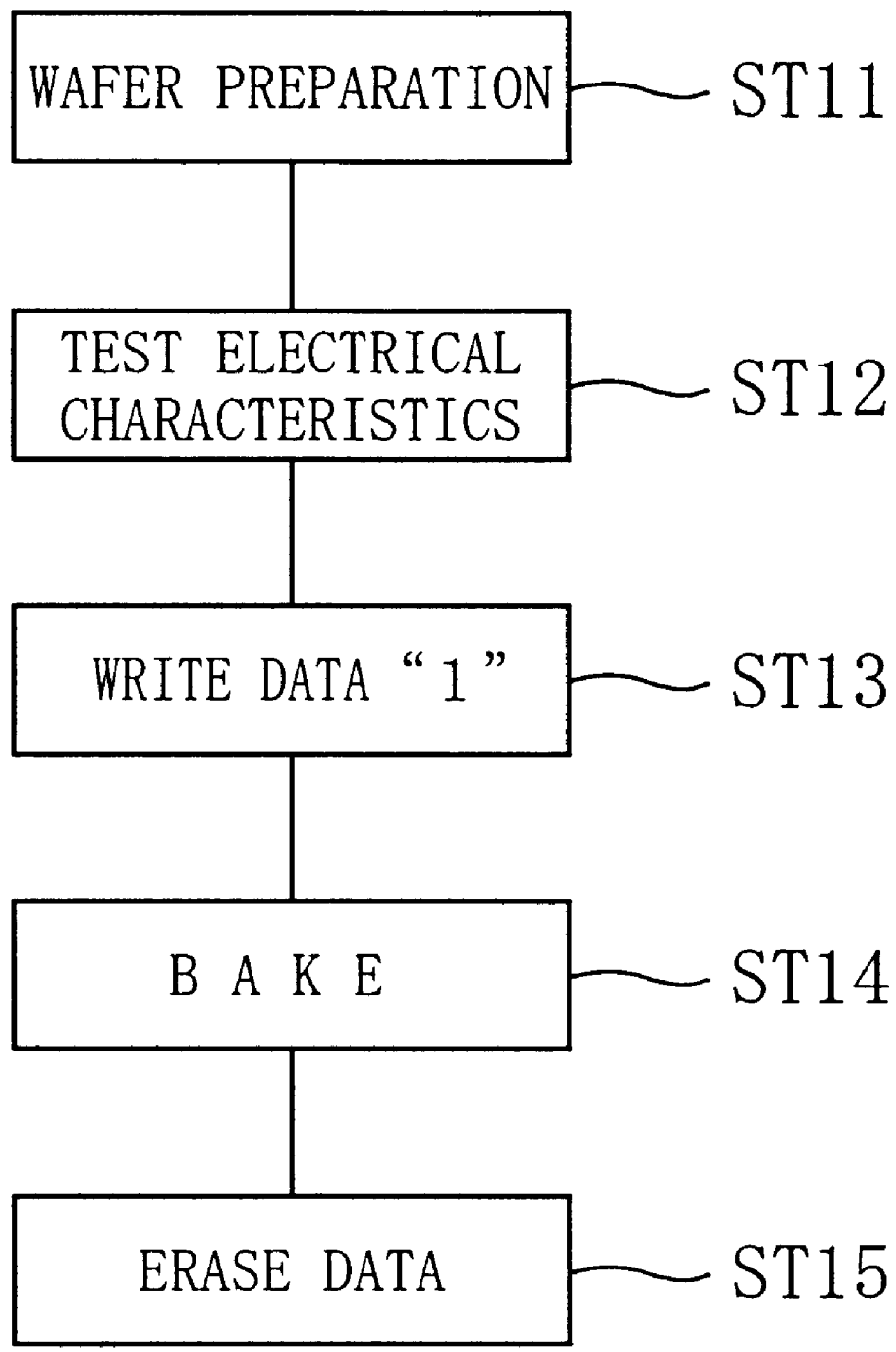
FIG. 6 is a flowchart illustrating a process of fabricating a ferroelectric FET for a semiconductor memory device according to a third embodiment of the present invention.

FIG. 6 is a flowchart illustrating a process of fabricating a ferroelectric FET (see FIG. 4) for a semiconductor memory device according to the third embodiment.

First, in Step ST11, a wafer preparation process is performed. In this process step, the $SiO_2$ film 12 and first intermediate gate electrode 18 are formed. The source/drain regions 15 and 16 are defined by implanting dopant ions into the substrate 11. The second intermediate gate electrode 21, ferroelectric film 22 and control gate electrode 23 are formed over the first intermediate gate electrode 18, and the lines 25 and 26 are formed over an interlevel dielectric film (not shown).

Next, in Step ST12, the ferroelectric film 22 of the ferroelectric FET has its electrical characteristics tested. Specifically, in this process step, the ferroelectric film 22 is tested to see if various characteristics of the film 22, such as the voltage-polarization characteristic, are appropriate.

Subsequently, in Step ST13, data "1" is written on all the ferroelectric FETs. That is to say, the down polarization is created in the ferroelectric film 22. Thereafter, the ferroelectric film 22 of each ferroelectric FET is heated, thereby inducing the imprinting of the data "1" state. For example, if the ferroelectric film 22 is heated at 150° C. for about 10 hours, then the hysteresis loop of the ferroelectric film 22 initially shifts toward the data "1" state (i.e., so that the down polarization increases). That is to say, the imprint degradation is induced intentionally. However, this shift stops at a certain point in time, and the imprinting hardly advances after that.

Figure 7:
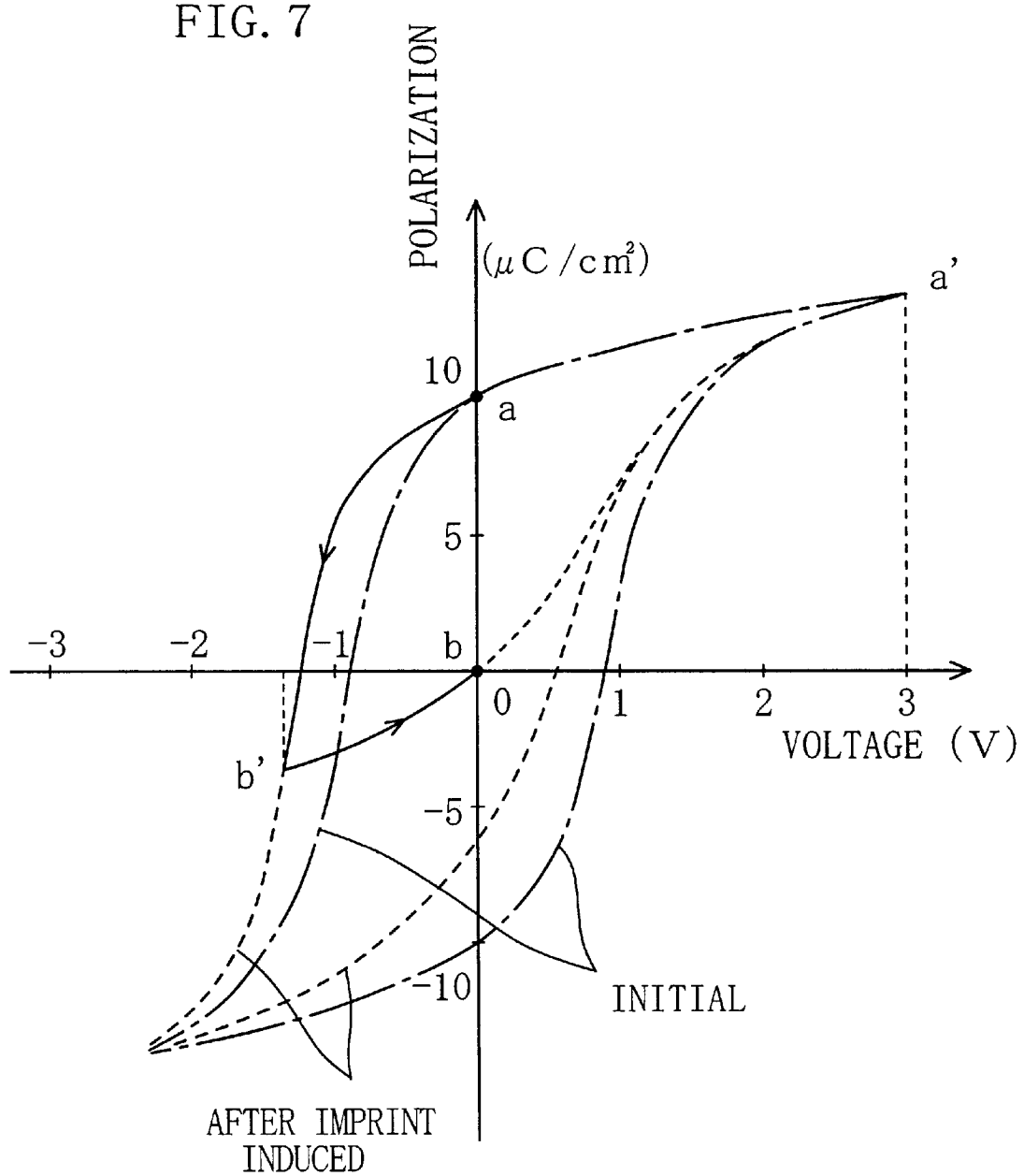
FIG. 7 illustrates how the hysteresis properties of a ferroelectric film change as a result of a heat treatment process according to the third embodiment.
Figure 8:
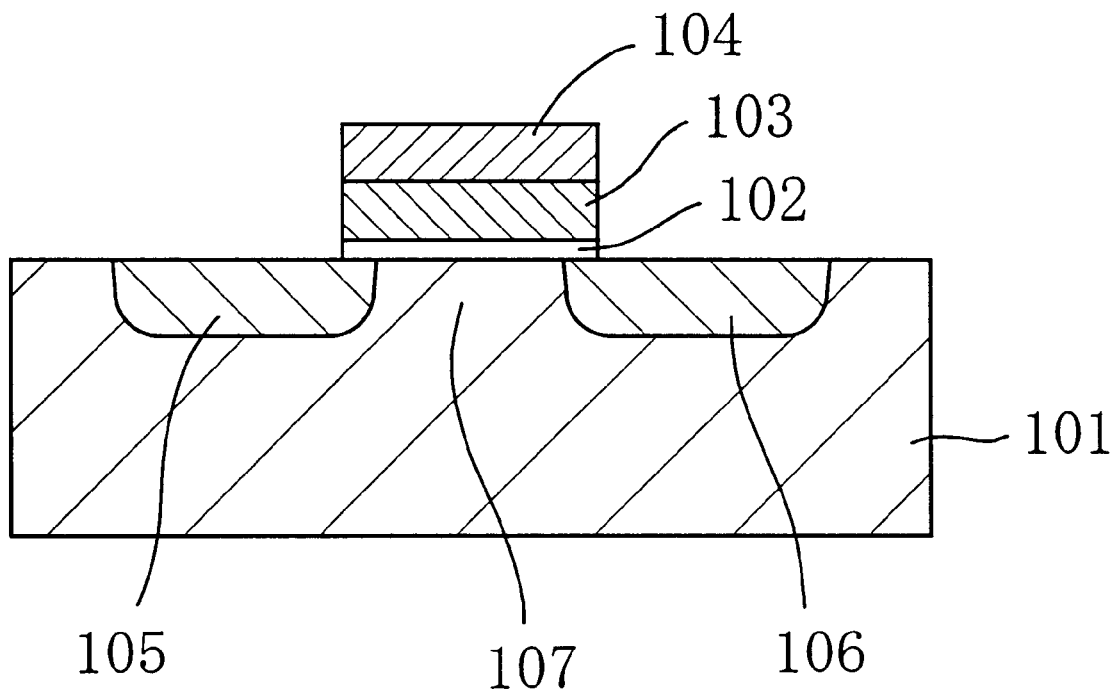
FIG. 8 is a cross-sectional view illustrating a known ferroelectric FET implemented as an MFISFET.

FIG. 7 illustrates how the hysteresis properties of a ferroelectric film 22 change in this step ST13. In FIG. 7, the abscissa represents the voltage applied between the control gate electrode 23 and second intermediate gate electrode 21, while the ordinate represents the polarization created in the ferroelectric film 22. In FIG. 7, the down polarization is regarded as a positive one. As shown in FIG. 7, the initial hysteresis loop of the ferroelectric film 22 is as represented by the one-dot chain. However, once the imprinting has been induced, the hysteresis loop of the ferroelectric film 22 changes into that represented by the dashed line. If data "1" has been stored in the ferroelectric film 22, the imprinting induced changes the hysteresis loop so that the coercive voltage (i.e., a voltage represented by the point b') has shifted from that of the initial hysteresis loop by about −0.2 V along the voltage axis. Also, even after the imprinting has been induced in the ferroelectric film 22, the slope of the curve changing from the point a into the point a" is much smaller than the slope of the curve changing from the point b into the point a". That is to say, the capacitance of the ferroelectric film 22 on which the data "1" has been written is much different from the capacitance of the ferroelectric film 22 on which the data "0" has been written. Accordingly, if the read voltage VR is applied to the control gate electrode 23 through the first line 25, then the voltage supplied to the first intermediate gate electrode 18 in the data "1" state is also greatly different from the voltage supplied thereto in the data "0" state. That is to say, the data can be read out accurately enough.

Subsequently, in Step ST14, the ferroelectric film 22 is baked. Then, in Step ST15, the data "1" is erased from all the ferroelectric FETs. In this example, data "0" is written on all the ferroelectric FETs to do so. To rewrite the data "1", stored in the ferroelectric film 22 with the hysteresis loop shifted by the imprinting, into the data "0", a negative voltage with an absolute value greater than that of −1 V should be supplied to the ferroelectric film 22 so that the polarization changes from the point a into the point b' as shown in FIG. 7. Optionally, this operation may also be realized by applying the ground potential to the control gate electrode 23 through the first line 25 and a voltage of 1 V or more to the second intermediate gate electrode 21 through the second line 26, respectively. Furthermore, the same effects are attainable even by heating the ferroelectric film 22 of the ferroelectric FET to its phase transition temperature or higher.

It should be noted that even if the down polarization remains in the ferroelectric film, the ferroelectric FET still may be used as a memory cell. In that case, the state in which there is the down remnant polarization in the ferroelectric film 22 may be regarded as the data "0" state, while the state in which there is almost no remnant polarization in the ferroelectric film 22 may be regarded as the data "1" state.

As can be seen, if the imprinting is induced in advance after the data "1" has been written, then it is possible to avoid the unwanted situation where the level of a read signal that should represent the data "1" deviates from its initial level due to the imprint degradation. As for the data "0" state, the imprinting cannot happen because the almost zero polarization state is associated with this data state in the illustrated embodiment. Thus, according to this embodiment, the imprinting hardly advances and the level of the read signal does not deviate from its initial value no matter whether the data is "1" or "0". The same effects are also attainable by an array of memory cells in which the ferroelectric FETs of this embodiment are arranged in a matrix fashion. In that case, the control gate electrodes 23 of the ferroelectric FETs may be connected to the first lines 25 as word lines and the respective drain regions 16 of the ferroelectric FETs may be connected to bit lines.

ALTERNATIVE EMBODIMENT

Figure 12:
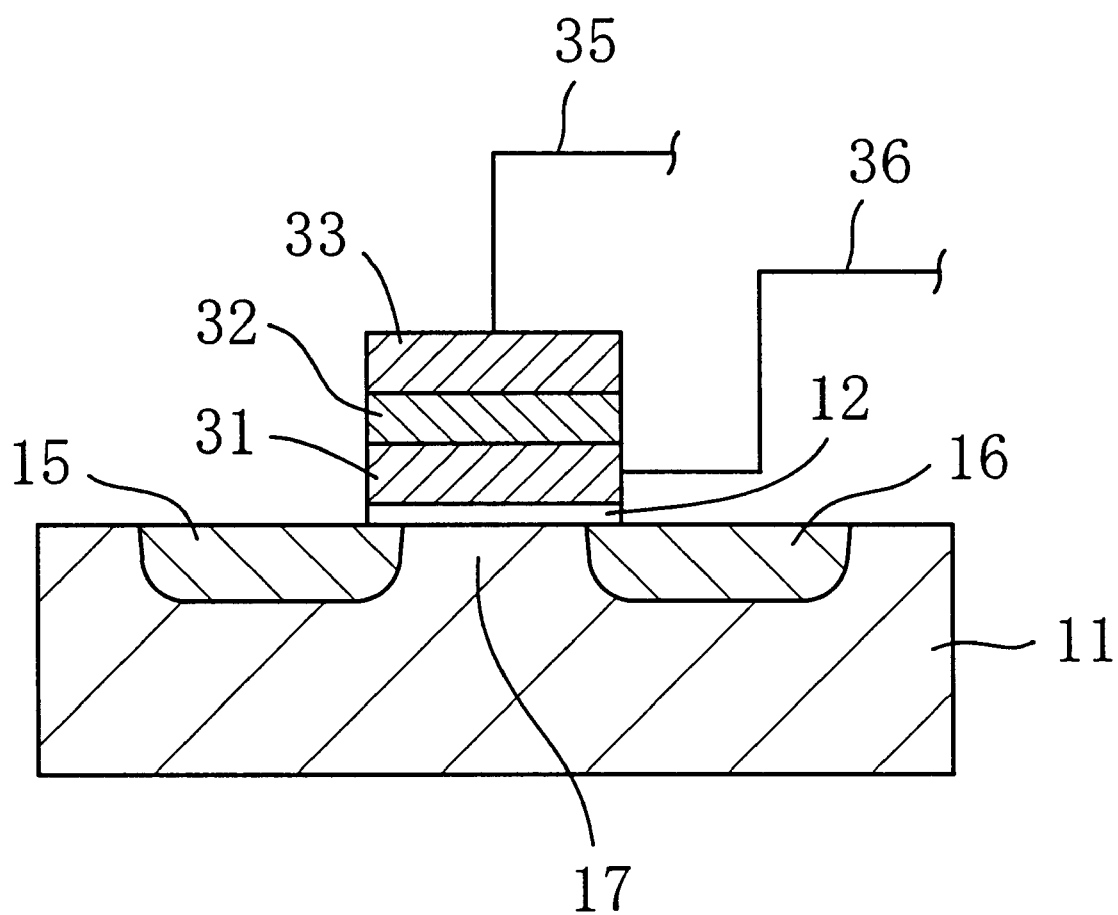
FIG. 12 is a cross-sectional view illustrating the application of the second embodiment to a ferroelectric FET with an MFMIS structure.

FIG. 12 is a cross-sectional view illustrating a ferroelectric FET with a so-called MFMIS structure. As shown in FIG. 12, the FET includes silicon substrate 11, $SiO_2$ film 12, intermediate gate electrode 31, ferroelectric film 32, control gate electrode 33 and source/drain regions 15 and 16. The $SiO_2$ film 12, intermediate gate electrode 31, ferroelectric film 32 and control gate electrode 33 are stacked in this order on the substrate 11. The intermediate and control gate electrodes 31 and 33 are made of a conductor like Pt. The ferroelectric film 32 is made of a metal oxide such as lead zirconate titanate (PZT) or bismuth strontium tantalate (SBT). The source/drain regions 15 and 16 are defined in the substrate 11 and located on right- and left-hand sides of the intermediate gate electrode 31. In this device, part of the substrate 11 under the $SiO_2$ film 12 serves as a channel region 17. The control and intermediate gate electrodes 33 and 31 are connected to first and second lines 35 and 36, respectively.

Data can also be written, rewritten or read out as in the second embodiment by using a ferroelectric FET like this as a memory cell for a semiconductor memory device. And the effects of the second embodiment are also attainable by this alternative embodiment. Furthermore, as in the third embodiment, the imprinting toward the down polarization can be intentionally induced in the ferroelectric film 32 by using the ferroelectric FET shown in FIG. 12 as a memory cell for a semiconductor memory device.

What is claimed is:

1. A semiconductor memory device comprising a field effect transistor, the transistor including:

a semiconductor substrate;

a ferroelectric film and a gate electrode stacked in this order over the substrate; and source/drain regions defined in the substrate and located on right- and left-hand sides of the gate electrode, wherein the ferroelectric film exhibits a first or second type of polarization, the first type of polarization being created when a voltage is applied to the gate electrode so that the electrode has a positive potential level with respect to the substrate, the second type of polarization being created when another voltage is applied to the gate electrode so that the electrode has a negative potential level with respect to the substrate, and wherein data in a first or second logical state is stored in the ferroelectric film, the first logical state being defined as a state in which one of the first and second types of polarization remains in the ferroelectric film to which zero voltage is being applied, the second logical state being defined as a state in which a polarization from less than the opposite polarization to the one type of polarization defined to be the first logical state to zero or almost zero remnant polarization remaining in the ferroelectric film to which the zero voltage is being applied.

2. The device of claim 1, wherein in reading out data from the ferroelectric film, a bias voltage is applied to the gate electrode.

3. The device of claim 2, wherein as data is repeatedly read out with the bias voltage applied, the other type of polarization, remaining in the ferroelectric film, gradually decreases toward zero, and wherein in reading out data, the first logical state is defined as a state in which a current, substantially equal in amount to a current that flowed when the one type of polarization was written, flows between the source/drain regions, and the second logical state is defined as a state in which a current in a predetermined range flows between the source/drain regions, the range being limited by a current that flowed when the other type of polarization was written and a current that flowed when the other type of polarization reached almost zero.

4. A semiconductor memory device comprising a field effect transistor, the transistor including:

a semiconductor substrate;

a ferroelectric film and a gate electrode stacked in this order over the substrate; and source/drain regions defined in the substrate and located on right- and left-hand sides of the gate electrode, wherein the ferroelectric film exhibits a first or second type of polarization, the first type of polarization being created when a voltage is applied to the gate electrode so that the electrode has a positive potential level with respect to the substrate, the second type of polarization being created when another voltage is applied to the gate electrode so that the electrode has a negative potential level with respect to the substrate, and wherein data in a first or second logical state is stored in the ferroelectric film, the first logical state being defined as a state in which one of the first and second types of polarization remains in the ferroelectric film to which zero voltage is being applied, the second logical state being defined as a state in which a polarization from less than the opposite polarization to one the type of polarization defined to be the first logical state to zero or almost zero remnant polarization remaining in the ferroelectric film to which the zero voltage is being applied.

5. The device of claim 4, wherein data in the first logical state and data in the second logical state are written on the ferroelectric film by applying voltages with mutually different absolute values to the gate electrode.

6. The device of claim 4, wherein the transistor further comprises:

a gate insulating film deposited on the substrate; and an intermediate gate electrode formed on the gate insulating film, and wherein the ferroelectric film is deposited on the intermediate gate electrode, and wherein the gate electrode is formed on the ferroelectric film, and wherein in writing data, the first or second type of polarization is allowed to remain in the ferroelectric film by regulating a voltage applied between the gate electrode and the intermediate gate electrode, and wherein in reading data, a bias voltage is applicable to the gate electrode by making the intermediate gate electrode floating.

7. The device of claim 4, wherein the transistor further comprises:

a gate insulating film deposited on the substrate;

a first intermediate gate electrode formed on the gate insulating film; and a second intermediate gate electrode, which is formed separately from, and is electrically connected to, the first intermediate gate electrode, and wherein the ferroelectric film is deposited on the second intermediate gate electrode, and wherein the gate electrode is formed on the ferroelectric film, and wherein in writing data, the first or second type of polarization is allowed to remain in the ferroelectric film by regulating a voltage applied between the gate electrode and the second intermediate gate electrode, and wherein in reading data, a bias voltage is applicable to the gate electrode by making the first and second intermediate gate electrodes floating.

8. A method for driving a semiconductor memory device, the device including a field effect transistor, the transistor including: a semiconductor substrate; a ferroelectric film and a gate electrode stacked in this order over the substrate; and source/drain regions defined in the substrate and located on right- and left-hand sides of the gate electrode, the ferroelectric film exhibiting a first or second type of polarization, the first type of polarization being created when a voltage is applied to the gate electrode so that the electrode has a positive potential level with respect to the substrate, the second type of polarization being created when another voltage is applied to the gate electrode so that the electrode has a negative potential level with respect to the substrate, wherein data in a first or second logical state is read out from the ferroelectric film, the first logical state being defined as a state in which one of the first and second types of polarization remains in the ferroelectric film to which zero voltage is being applied, the second logical state being defined as a state in which a polarization from less than the opposite polarization to one the type of polarization defined to be the first logical state to zero or almost zero remnant polarization remaining in the ferroelectric film to which the zero voltage is being applied.

9. The method of claim 8, wherein in reading out data from the ferroelectric film, a bias voltage is applied to the gate electrode.

10. The method of claim 9, wherein as data is repeatedly read out with the bias voltage applied, the other type of polarization, remaining in the ferroelectric film, gradually decreases toward zero, and wherein in reading out data, the first logical state is defined as a state in which a current, substantially equal in amount to a current that flowed when the one type of polarization was written, flows between the source/drain regions, and the second logical state is defined as a state in which a current in a predetermined range flows between the source/drain regions, the range being limited by a current that flowed when the other type of polarization was written and a current that flowed when the other type of polarization reached zero or almost zero.

11. The method of claim 9, wherein the bias voltage applied to the gate electrode has such a value as maximizing a difference between a current flowing between the source/drain regions when the data stored in the ferroelectric film is in the first logical state and a current flowing between the source/drain regions when the data stored in the ferroelectric film is in the second logical state.

12. A method for driving a semiconductor memory device, the device including a field effect transistor, the transistor including: a semiconductor substrate; a ferroelectric film and a gate electrode stacked in this order over the substrate; and source/drain regions defined in the substrate and located on right- and left-hand sides of the gate electrode, the ferroelectric film exhibiting a first or second type of polarization, the first type of polarization being created when a voltage is applied to the gate electrode so that the electrode has a positive potential level with respect to the substrate, the second type of polarization being created when another voltage is applied to the gate electrode so that the electrode has a negative potential level with respect to the substrate, wherein data in a first or second logical state is stored in the ferroelectric film, the first logical state being defined as a state in which one of the first and second types of polarization remains in the ferroelectric film to which zero voltage is being applied, the second logical state being defined as a state in which a polarization from less than the opposite polarization to one the type of polarization defined to be the first logical state to zero or almost zero remnant polarization remaining in the ferroelectric film to which the zero voltage is being applied, and wherein in reading out data from the ferroelectric film, a bias voltage is applied to the gate electrode.

13. The method of claim 12, wherein the voltage applied to the gate electrode when data in the first logical state is written on the ferroelectric film has an absolute value different from that of the voltage applied to the gate electrode when data in the second logical state is written on the ferroelectric film.

14. The method of claim 12, wherein the transistor further comprises: a gate insulating film deposited on the substrate; and an intermediate gate electrode formed on the gate insulating film, the ferroelectric film being deposited on the intermediate gate electrode, the gate electrode being formed on the ferroelectric film, and wherein in writing data, a voltage is applied between the gate electrode and the intermediate gate electrode, and wherein in reading data, a bias voltage is applied to the gate electrode by making the intermediate gate electrode floating.

15. The method of claim 12, wherein the transistor further comprises: a gate insulating film deposited on the substrate; a first intermediate gate electrode formed on the gate insulating film; and a second intermediate gate electrode, which is formed separately from, and is electrically connected to, the first intermediate gate electrode, the ferroelectric film being deposited on the second intermediate gate electrode, the gate electrode being formed on the ferroelectric film, and wherein in writing data, a voltage is applied between the gate electrode and the second intermediate gate electrode, and wherein in reading data, a bias voltage is applied to the gate electrode by making the first and second intermediate gate electrodes floating.

16. The method of claim 12, wherein in writing data in the second logical state on the ferroelectric film, the bias voltage applied to the gate electrode is so regulated as to make a voltage supplied to the ferroelectric film substantially equal to a coercive voltage of the ferroelectric film.

17. The method of claim 14, wherein either after data has been written on the ferroelectric film or before data is read out from the ferroelectric film, the intermediate gate electrode is once grounded and then made floating.

18. The method of claim 12, wherein in reading out data that has been written on the ferroelectric film, the voltage applied to the gate electrode is so regulated as to make a voltage supplied to the ferroelectric film lower than a coercive voltage of the ferroelectric film.

19. A method for fabricating a semiconductor memory device, comprising the steps of:

a) forming a memory cell including a field effect transistor, the transistor including: a semiconductor substrate; a ferroelectric film and a gate electrode stacked in this order over the substrate; and source/drain regions defined in the substrate and located on right- and left-hand sides of the gate electrode, the ferroelectric film exhibiting a first or second type of polarization, the first type of polarization being created when a voltage is applied to the gate electrode so that the electrode has a positive potential level with respect to the substrate, the second type of polarization being created when another voltage is applied to the gate electrode so that the electrode has a negative potential level with respect to the substrate;

b) applying a voltage, which has the same polarity as a voltage applied for reading out data, to the ferroelectric film and then removing the former voltage so that the first type of polarization remains in the ferroelectric film; and c) heating the ferroelectric film for a predetermined period of time, thereby shifting hysteresis properties of the ferroelectric film in such a direction that a coercive voltage, needed to reverse the type of polarization from the first into the second, increases and making the hysteresis properties of the ferroelectric film asymmetric.

20. The method of claim 19, further comprising the step of erasing the first type of polarization remaining in the ferroelectric film after the step b) has been performed.

* * * * *